(12) United States Patent
Sugita et al.

(10) Patent No.: US 7,872,414 B2
(45) Date of Patent: Jan. 18, 2011

(54) LIGHT EMITTING ELEMENT AND DISPLAY DEVICE WITH IMPROVED EXTERNAL COUPLING EFFICIENCY

(75) Inventors: Tatsuya Sugita, Takahagi (JP); Masaya Adachi, Hitachi (JP); Hiroshi Sasaki, Mito (JP)

(73) Assignee: Hitachi Displays, Ltd., Chiba (JP)

( * ) Notice: Subject to any disclaimer, the term of this patent is extended or adjusted under 35 U.S.C. 154(b) by 892 days.

(21) Appl. No.: 11/070,123

(22) Filed: Mar. 1, 2005

(65) Prior Publication Data
US 2005/0194896 A1    Sep. 8, 2005

(30) Foreign Application Priority Data
Mar. 3, 2004    (JP) .............................. 2004-058351

(51) Int. Cl.
*H01J 1/70* (2006.01)
(52) U.S. Cl. ...................................... 313/506
(58) Field of Classification Search ................. 313/506
See application file for complete search history.

(56) References Cited

U.S. PATENT DOCUMENTS

| | | | |
|---|---|---|---|
| 6,455,878 B1 * | 9/2002 | Bhat et al. ..................... | 257/99 |
| 6,585,876 B2 | 7/2003 | Dordi et al. | |
| 6,586,876 B2 | 7/2003 | Tsai et al. | |
| 6,740,416 B1 | 5/2004 | Yokogawa et al. | |
| 6,841,272 B2 * | 1/2005 | Shoshi et al. ................ | 428/697 |
| 6,963,086 B2 | 11/2005 | Oohata | |
| 6,985,275 B2 | 1/2006 | Miyazawa | |
| 2003/0116719 A1 | 6/2003 | Miyazawa | |
| 2003/0122481 A1 * | 7/2003 | Song et al. ................... | 313/506 |
| 2003/0207112 A1 * | 11/2003 | Yadav .......................... | 428/402 |
| 2003/0230972 A1 * | 12/2003 | Cok ............................. | 313/504 |
| 2004/0104672 A1 * | 6/2004 | Shiang et al. ................ | 313/506 |
| 2004/0233552 A1 * | 11/2004 | Tonar et al. .................. | 359/838 |
| 2005/0073243 A1 * | 4/2005 | Yamazaki et al. ........... | 313/498 |

FOREIGN PATENT DOCUMENTS

CN    1335805 A    2/2002

(Continued)

OTHER PUBLICATIONS

Kido, et al., "High Efficiency Organic EL Devices Having Charge Generation Layers", SID 03 Digest, pp. 964-965.

(Continued)

*Primary Examiner*—Joseph L Williams
*Assistant Examiner*—Fatima N Farokhrooz
(74) *Attorney, Agent, or Firm*—Antonelli, Terry, Stout & Kraus, LLP.

(57) ABSTRACT

A light-emitting device which is manufactured by a simple manufacturing method and which efficiently extracts light emitted from an emissive layer outward to improve the light extraction efficiency. The light-emitting device comprises a first electrode, a second electrode and an emissive layer disposed between them and extracts a part of light emitted from the emissive layer as radiated light. In this light-emitting device, the first electrode, the nano-structure layer for extracting the radiated light, and a gap having a refractive index lower than an average refractive index of the emissive layer and a nano-structure layer, are arranged in that order in a direction in which the radiated light is extracted.

14 Claims, 15 Drawing Sheets

FOREIGN PATENT DOCUMENTS

| | | |
|---|---|---|
| JP | 2991183 | 10/1999 |
| JP | 2002-050793 A | 2/2002 |
| JP | 2002-278477 | 9/2002 |
| JP | 2003-077647 | 3/2003 |
| JP | 2003142262 A | 5/2003 |
| JP | 2003-163075 | 6/2003 |
| JP | 2004-031221 | 1/2004 |
| TW | 09520606600 | 8/1995 |

OTHER PUBLICATIONS

Shosaku Tanaka, "Journal of Information & Picture Media Society", vol. 54, No. 8, Jun. 7, 2000, pp. 1115-1120.

Tsutsui, et al., "Doubling Coupling-Out Efficiency in Organic Light-Emitting Devices Using a Thin Silica Aerogel Layer", Advanced Materials, 13, No. 15, Aug. 3, 2001, pp. 1149-1152.

I. H. Malitson, "International Comparison of the Refractive Index of Fused Silica", Oct. 1965, pp. 1205-1209, vol. 55, No. 10, Journal of the Optical Society of America.

Weichuan Du et al., "High Refractive Index Films Prepared from Titanium Chloride and Methyl Methacrylate via a Non-Aqueous Sol-Gel Route", Journal of Sol-Gel Science and Technology 34, pp. 227-231, 2005 Springer Science= Business Media, Inc.

* cited by examiner

LIGHT EMITTING ELEMENT AND DISPLAY DEVICE WITH IMPROVED EXTERNAL COUPLING EFFICIENCY

BACKGROUND OF THE INVENTION

The present invention relates to a light-emitting device, an emissive type display having a plurality of the light-emitting devices arranged in matrix and controlling their light emitting operation for displaying an image, and an illumination device using the light-emitting devices.

An organic light-emitting diode (OLED) is a device which, when its emissive layer formed of an organic thin film is injected with holes and electrons, transforms an electric energy into a light energy to emit light. Unlike a non-emissive type display as represented by a liquid crystal display, an emissive type display having the organic light-emitting diodes as light-emitting devices (referred to as "OLED display") is self-luminous and requires no auxiliary light source such as a backlight and therefore has an advantage of being thin and lightweight. The OLED display is characterized by a wide view angle and a high response speed.

The OLED has a substrate deposited successively with an optically transparent electrode, a hole transporting layer, an emissive layer, an electron transporting layer and a reflective electrode formed of a light reflecting metal. Applying a DC voltage between the transparent electrode and the reflective electrode causes an emission of light of a predetermined wavelength from the emissive layer. A part of light emitted from the emissive layer passes through the transparent electrode to be seen by an observer. At this time, since rays emitted almost parallel to the surfaces of laminated layers and those with incidence angles at the interfaces of layers greater than a critical angle propagate in a direction parallel to the laminated layer surfaces and not toward the observer, they are not put to effective use as display light.

Generally, an external coupling efficiency (a ratio of a quantity of light leaving the device toward an observer to a quantity of light emitted from the emissive layer) is said to be around 20% according to an estimation by classical optics. A large part of the light emitted from the emissive layer propagates in a direction parallel to the laminated layer surfaces and is lost. Thus, to realize an OLED display with high brightness and low power consumption, it is important to reduce a propagation loss and improve the external coupling efficiency.

To meet this requirement, JP-A-2002-278477 discloses an active matrix light-emitting device which comprises an emissive layer formed in a matrix shape, a transparent conductive layer to supply electrons or holes to the emissive layer, and a TFT substrate formed with a matrix control circuit for controlling an emission of the emissive layer. The active matrix light-emitting device is characterized by a low refractive index layer provided on a surface of the transparent conductive layer on an opposite side of the emissive layer and which has a refractive index of 1.01 to 1.3.

Japanese Patent No. 2991183 and JP-A-2003-163075 disclose an organic electroluminescence element that has one or more organic layers including an emissive layer between an anode and a cathode and which also has a grating or zone plate formed in a position that prevents a total reflection on an interface of the element.

However, a low-refractive index layer has a low refractive index that common materials cannot achieve and which in JP-A-2002-278477 could only be realized by the use of a special material such as silica aerogel. A fabrication of silica aerogel requires a special method and is difficult to accomplish.

Where a conventional grating is used, the quantity of light changes depending on the wavelength and visual angle because light, that would pass through a device interface if no grating was provided, is refracted by the grating. Furthermore, ambient light is also refracted, so a polarization of light refracted by the grating changes, giving rise to a problem of reduced contrast.

An object of this invention is to improve an external coupling efficiency to efficiently extract to the outside light emitted from the emissive layer by using a simple manufacturing method.

Another object of this invention is to provide an emissive type display (OLED display) and an illumination device both of which minimize a reduction in contrast and improve the external coupling efficiency.

SUMMARY OF THE INVENTION

Viewed from one aspect the present invention provides a light-emitting device which comprises a first electrode, a second electrode and an emissive layer disposed between the first electrode and the second electrode; wherein a part of light emitted from the emissive layer is extracted as radiated light; wherein the first electrode, a light extraction layer to extract the radiated light, and a low refractive index layer having a lower refractive index than an average refractive index of the emissive layer and the light extraction layer are arranged in order in a direction in which the radiated light is extracted.

Further, a first electrode and a light extraction layer having a lower refractive index than an average refractive index of the emissive layer are arranged in that order in a direction in which the radiated light is extracted. The light extraction layer is hydrophilic.

Further, a first electrode, a light extraction layer to extract the radiated light, and a low refractive index layer having a lower refractive index than an average refractive index of the emissive layer are arranged in that order in a direction in which the radiated light is extracted. The light extraction layer has a periodic structure.

Further, a first electrode, a high refractive index layer having a higher refractive index than an average refractive index of the first electrode, and a light extraction layer to extract the radiated light are arranged in that order in a direction in which the radiated light is extracted. An average refractive index of the light extraction layer is lower than that of the emissive layer.

Further, a first electrode, a light extraction layer to extract the radiated light and a low refractive index layer having a lower refractive index than an average refractive index of the emissive layer are arranged in that order in a direction in which the radiated light is extracted. The light extraction layer includes a metal layer.

Further, a first electrode and a light extraction layer having a lower average refractive index than that of the emissive layer are arranged in that order in a direction in which light radiated from the emissive layer is extracted. The light extraction layer is a light scattering layer.

Further, a first electrode and a light extraction layer to extract radiated light are arranged in that order in a direction in which the radiated light is extracted. An average refractive index of the light extraction layer is between 1.1 and 1.5.

Further, the first electrode, a first light extraction layer having pores and a second light extraction layer having pores and a different refractive index than that of the first light extraction layer are arranged in that order in a direction in which light radiated from the emissive layer is extracted. An average diameter of pores in the first light extraction layer is smaller than that of pores in the second light extraction layer.

Further, a percentage of a volume that the pores occupy in the first light extraction layer is smaller than that in the second light extraction layer.

An emissive type display has a plurality of light-emitting devices, each having an emissive layer disposed between a first electrode and a second electrode. The plurality of light-emitting devices are arranged in matrix. A circular polarizer is provided on that side of the emissive layer from which light radiated from the emissive layer is extracted. A light emitting operation of the light-emitting device is controlled to produce an image. The first electrode, the light extraction layer to extract the radiated light and a low refractive index layer having a lower refractive index than an average refractive index of the emissive layer and the light extraction layer are arranged in that order in a direction in which the radiated light is extracted. The light extraction layer is almost transparent at a visible wavelength. A light scattering by the light extraction layer at the visible wavelength is smaller than that at an ultraviolet wavelength.

Further, the first electrode, the light extraction layer to extract the radiated light and a low refractive index layer having a lower refractive index than an average refractive index of the emissive layer and the light extraction layer are arranged in that order in a direction in which the radiated light is extracted. The second electrode has a low reflectivity at a visible wavelength.

Further, an illumination device is provided which has at least one light-emitting device and using light emitted from the light-emitting device for illumination, the light-emitting device comprising a first electrode, a second electrode, and an emissive layer disposed between the first electrode and the second electrode; wherein the first electrode, a light extraction layer to extract the radiated light, and a low refractive index layer having a lower refractive index than an average refractive index of the emissive layer and the light extraction layer are arranged in that order in a direction in which the radiated light is extracted.

This invention allows the light-emitting device to be manufactured by a simple method and improves an efficiency for extracting light emitted from the emissive layer outward.

Further, with this invention it is possible to provide an emissive type display and an illumination device with an improved light extraction efficiency.

Other objects, features and advantages of the invention will become apparent from the following description of the Embodiments of the invention taken in conjunction with the accompanying drawings.

DETAILED DESCRIPTION OF THE EMBODIMENTS

The light-emitting device, the display and the illumination device of this invention are provided with an external coupling means that converts a guided mode, in which light emitted from the emissive layer is guided in a direction almost parallel to the laminated layer surfaces, into a radiation mode.

The light-emitting device, the display and the illumination device of this invention are provided with an external coupling structure having a random or periodical micro-structure smaller than the wavelength. This external coupling structure can reduce effects oh a transmitted mode that is directly extracted from the light-emitting device without being guided along the laminated layer surfaces and on ambient light of visible wavelength. The external coupling structure also allows the guided mode to be converted into the radiation mode.

Embodiment 1

Figure 1:
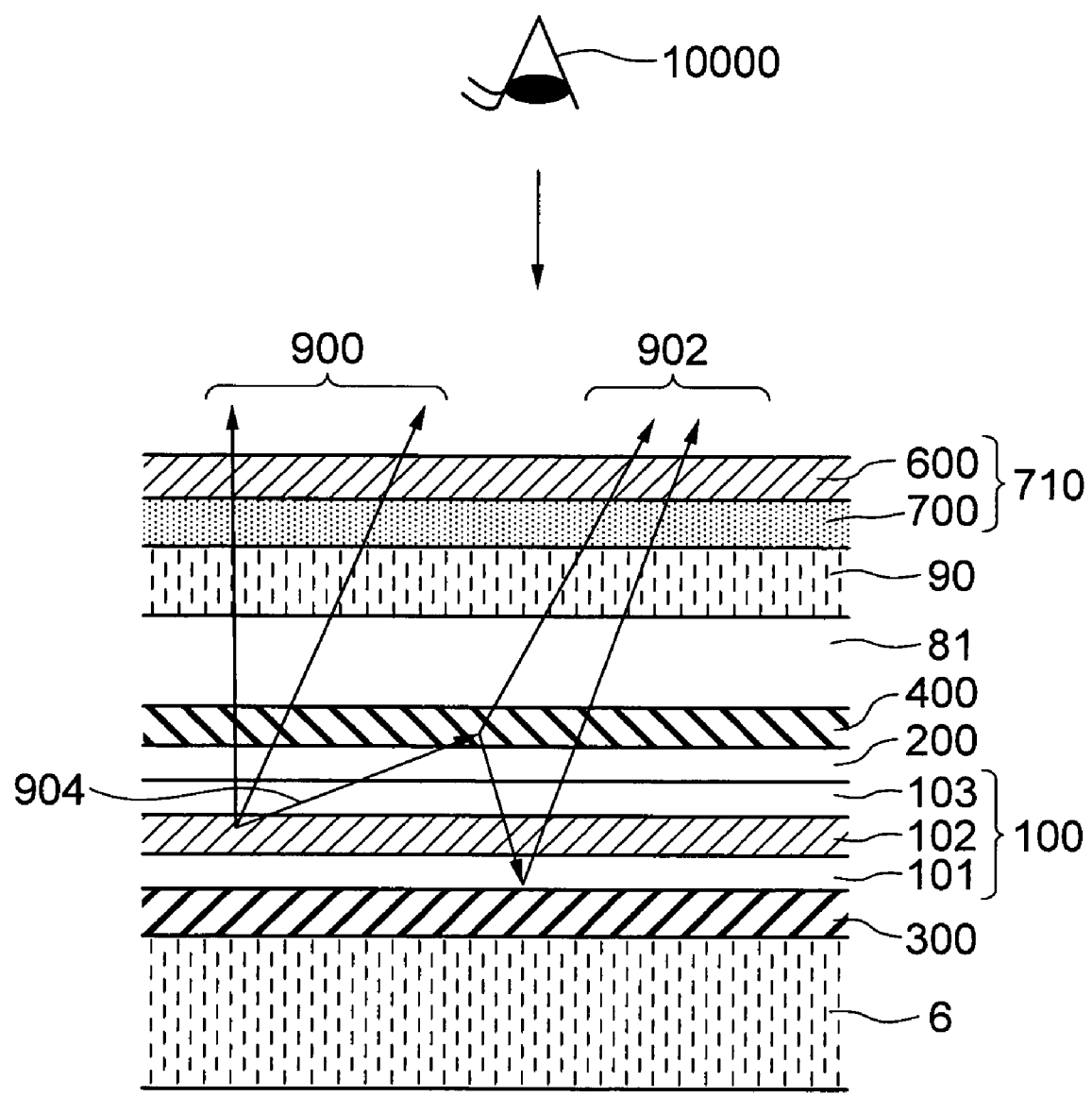
FIG. 1 is a cross-sectional view showing how a light-emitting device of this invention is implemented (Embodiment 1).

FIG. 1 shows a cross section of one Embodiment of a light-emitting device according to this invention.

The light-emitting device of this Embodiment is a so-called top-emission type organic light-emitting diode (hereinafter referred to as an OLED) that emits light from a side or surface opposite a substrate 6. An organic layer 100 making up the OLED is formed on a reflective electrode 300 that is formed over the substrate 6 and also serves as a reflective layer. A transparent electrode 200 is formed over the organic layer 100. Applying a DC voltage between the transparent electrode 200 and the reflective electrode 300 to pass a current between them causes the organic layer 100 to emit light of a wavelength corresponding to a predetermined color. One of the transparent electrode 200 and the reflective electrode 300 works as an anode and the other as a cathode. Here, it is supposed that the transparent electrode 200 serves as the anode and the reflective electrode 300 as the cathode. The organic layer 100 has an electron transporting layer 101, an emissive layer 102 and a hole transporting layer 103 stacked in that order from the cathode side between the anode and the cathode. The organic layer 100 is not limited to the three-layer structure and may employ a four-layer structure with an additional hole injecting layer provided between the anode and the hole transporting layer or a two-layer structure with one layer serving both as the emissive layer and the electron transporting layer. In the description that follows, thin layers making up the OLED that are formed between the cathode and the anode, including an emissive layer, are referred to simply as the organic layer 100.

Over the transparent electrode 200 is formed a nano-structure layer 400 that functions as a light extracting layer. A gap 81 is provided above the nano-structure layer 400 and then the organic layer 100 is hermetically sealed with a transparent sealing plate 90. On the transparent sealing plate 90 is arranged a circular polarizer 710 having a quarter wave plate 700 and a polarizer 600 stacked together. The circular polarizer 710 prevents ambient light 908 reflected by the reflective electrode 300 from going out of the device and thereby minimizes a reduction in contrast.

In this Embodiment, the nano-structure layer 400 uses a film with a structure smaller than the wavelength which passes the transmitted light 900, the radiation mode of light emitted from the organic layer 100, leaving it almost intact and which works as a scatter layer for the waveguided light 904, the guided mode of light, that propagates trapped in the transparent electrode 200 or organic layer 100. It is preferred that the nano-structure layer 400 have a layer that has minute pores or particles less than the wavelength scattered in the base material and which has an average refractive index for visible light smaller than that of the transparent electrode 200 or organic layer 100.

Here, the light extracting function of the nano-structure layer 400 will be explained. Light, produced by the organic layer 100 and entering the surrounding layers at smaller incidence angles than the critical angle at an interface between the transparent electrode 200 and the nano-structure layer 400 and at an interface between the nano-structure layer 400 and the gap 81, passes successively through the transparent electrode 200 and the nano-structure layer 400 and is then emitted as transmitted light 900 from the light-emitting device. The remaining light propagates trapped in the transparent electrode 200 and the organic layer 100 because the refractive indices of these layers are high. A conventional OLED display has a high proportion of the waveguided light 904, resulting in a low external coupling efficiency. In this Embodiment, the waveguided light 904 is scattered by the nano-structure layer 400 to improve the external coupling efficiency. Since the refractive index of the nano-structure layer 400 is low, the waveguided light 904 propagates inside the transparent electrode 200 or organic layer 100. During the propagation, a part of the waveguided light 904 leaks as evanescent light into the nano-structure layer 400. If we let the refractive index of a high refractive index medium be $n_1$ and that of a low refractive index medium be $n_2$, then a wavelength $\lambda e$ of the evanescent wave can be expressed as $$\lambda_e = \frac{n_2}{n_1 \sin\theta_1}\lambda_2 = \frac{\lambda_0}{n_1 \sin\theta_1} \quad (1)$$

In this Embodiment $n_1$ is a refractive index of the transparent electrode 200 and $n_2$ is a refractive index of the nano-structure layer 400. $\lambda_0$ represents a wavelength in vacuum, $\lambda_1$ a wavelength in the high refractive index medium and $\lambda_2$ a wavelength in the low refractive index medium. Then we get $$\lambda_0 = n_1\lambda_1 = n_2\lambda_2 \quad (2)$$

The wavelength of evanescent wave perpendicular to the interface is expressed mathematically in an imaginary number, so its wavelength $\lambda_e$ is shorter than the wavelength $\lambda_0$ in the vacuum, as indicated by (1). The scattering by a structure smaller than the wavelength is expressed by Rayleigh scattering and the intensity of scattering by the Rayleigh scattering is inversely proportional to the wavelength raised to the fourth power. Thus, the evanescent wave leaking into the nano-structure layer 400 is strongly scattered by the microstructure of the nano-structure layer 400 and transformed into a radiation mode as scattered rays 902 that are emitted outside. During this process, to prevent the contrast of the display from degrading, it is desired that the transmitted light 900 be almost free from scattering, as explained later. In this Embodiment the size of the scattering bodies in the nano-structure layer 400 is controlled so that the evanescent wave of the scattered rays 902 can be more strongly scattered for external emission in a way that has almost no adverse effects on the transmitted light 900.

Because in the nano-structure layer 400 the ratio of scattering cross section between the transmitted light 900 and the evanescent waveguided light 904 is approximately $(n_2/n_1)^4$, it is desired that $n_1$ be set large and $n_2$ small to increase the scattering of the evanescent wave and reduce the scattering of the transmitted light 900. Further, since the light scattered by the nano-structure layer 400 is trapped inside the nano-structure layer 400 by the total reflection when $n_2$ is large, it is preferred that $n_2$ be set small also to prevent this trapping. A particularly desirable form of the nano-structure layer 400 therefore is a structure having micro-pores dispersed therein to reduce the average refractive index.

Next, a penetration depth of evanescent wave, $z_d$, representing a thickness of the layer where the intensity of the evanescent wave is $1/e^2$ is given by $$z_d = \frac{\lambda_1}{2\pi\left[\sin^2\theta_1 - \left(\frac{n_2}{n_1}\right)^2\right]^{1/2}} = \frac{\lambda_2}{2\pi\left[\left(\frac{\lambda_2}{\lambda_e}\right) - 1\right]^{1/2}} \quad (3)$$

In the nano-structure layer 400 the evanescent wave is scattered and extracted by a scattering bodies present at around this penetration depth from the transparent electrode 200. As described above, as the incidence angle increases, the penetration depth becomes small but the wavelength of evanescent wave also become short, making the scattering intensity large in inverse proportion to the wavelength raised to the fourth power. This means that light with a large incidence angle is subject to particularly strong scattering. Furthermore, light with a large incidence angle interacts with the scattering layer for a longer period of time. These indicate that the distribution of scattering bodies near the interface is particularly important. Therefore, the scattering bodies need not be present uniformly in the entire nano-structure layer 400 but need only be provided in a range at around this penetration depth.

Given the fact that, particularly for $\theta_2=90°$, light is strongly scattered by the scattering bodies located at the penetration depth $z_{90}$, it is desired that a large number of light scattering bodies be provided in a range at this penetration depth from the transparent electrode 200.

$$z_{90} = \frac{\lambda_0}{2\pi[n_1^2 - n_2^2]^{1/2}} \quad (4)$$

For an improved external coupling efficiency, the nano-structure layer 400 preferably has a strong scattering intensity. It is also desired that the nano-structure layer 400 have little scattering effect on the transmitted light 900. To minimize the scattering effect on the transmitted light 900, the nano-structure layer 400 is preferably reduced in thickness. To scatter evanescent waves occurring in the nano-structure layer 400, the thickness of the nano-structure layer 400 needs to be a few times, preferably about three times or more preferably about five times, the penetration depth determined by Equation (4). The layer thickness may be less than the penetration depth determined by Equation (4) because the scattering intensity at the interface is high and thus the effect of improving the external coupling efficiency can be obtained as long as the thickness is more than one-half the penetration depth.

The greater the proportion of evanescent light with respect to a total light energy that propagates as the waveguided light 904, the greater the effect the nano-structure layer 400 has of scattering the waveguided light 904. To take advantage of this fact, the waveguide layer preferably is thin and has a high refractive index. It is therefore desired that the transparent electrode 200 have a higher refractive index than that of the organic layer 100 and be reduced in thickness to such an extent that it still has a required electric resistance and does not pose a color change problem due to optical interferences. Alternatively, a thin film of a higher refractive index than that of the transparent electrode 200 may be formed between the transparent electrode 200 and the nano-structure layer 400.

Further, it is desired that the nano-structure layer 400 strongly scatter light toward the light extracting side. For example, a base material portion including pores preferably forms a network so as to be able to guide light.

The nano-structure layer 400 is a medium having a microstructure smaller than a wavelength and thus can be regarded as an optically uniform medium with an average refractive index in a visible wavelength range. When the refractive index of the nano-structure layer 400 can be measured, the measured value can be used as $n_2$. For the measurement of the average refractive index, a refractive index measuring means such as ellipsometer and prism coupler method may be used. Alternatively, the average refractive index may be determined by measuring a transmissivity and a reflectivity using a spectrophotometer and by substituting them into a calculation formula. It is also possible to determine the average refractive index from an interference pattern of reflected spectra or transmitted spectra. If a measurement cannot be taken of the refractive index of the nano-structure layer 400, a value may be used which is calculated by an effective medium approximation:

$$V_A \frac{\varepsilon_A - \varepsilon_m}{\varepsilon_A + 2\varepsilon_m} + V_B \frac{\varepsilon_B - \varepsilon_m}{\varepsilon_B + 2\varepsilon_m} = 0 \quad (5)$$

where $V_A$ and $V_B$ are volume percentages of medium A and medium B and $\varepsilon_A$ and $\varepsilon_B$ are permittivities of medium A and medium B, respectively. Each permittivity $\varepsilon$ can be determined from $$n = \sqrt{\varepsilon} \quad (6)$$

where n is a refractive index. In the case of the nano-structure layer 400, the base material and the pores can be taken as medium A and medium B respectively. It is noted that the whole nano-structure layer 400 does not need to be optically homogeneous and that its light scattering performance may be stronger on the side of an interface with the transparent electrode 200 or it may have an anisotropy in refractive index. When the nano-structure layer 400 has a refractive index anisotropy, the refractive index in a direction parallel to the interface is preferably smaller than that perpendicular to the interface. If there is a refractive index distribution, the average refractive index of the nano-structure layer 400 can be taken as an average of the overall refractive index.

The refractive index of the emissive layer 102 may use a refractive index of only the emissive layer 102 or an average refractive index of the organic layer 100. This is because the layers making up the organic layer 100 are so thin that their refractive indices as individual single layers are difficult to evaluate and because there are no large differences between the refractive indices of the electron transporting layer 101, the emissive layer 102 and the hole transporting layer 103.

Generally, the organic layer 100 has a refractive index of around 1.7 to 1.8 and that of the transparent electrode 200 is around 1.8 to 2.1. As described above, in the nano-structure layer 400 the smaller the refractive index, the greater contribution it makes to improving the external coupling efficiency. Therefore, in a visible wavelength range because the penetration depth $z_{90}$ determined from Equation (4) is less than 80 nm, the nano-structure layer 400 is preferably less than 400 nm, more preferably less than 240 nm, in thickness. The nano-structure layer 400 can function well as a light extracting layer as long as its thickness is more than 40 nm or preferably 80 nm.

When the nano-structure layer 400 is formed, if the transparent sealing plate 90 is directly attached to the nano-structure layer 400 without forming the gap 81, evanescent waves are tunnel-coupled to the transparent sealing plate 90 and transmitted to it. The transmitted light then becomes waveguided light in the transparent sealing plate 90, which is not extracted. Thus, when the gap 81 is not provided, the nano-structure layer 400 needs to be made sufficiently thicker than the penetration depth of evanescent waves and, to reduce the scattering of the transmitted light 900, the light scattering ability of the nano-structure layer 400 must be reduced. This weakens the scattering of evanescent waves, contributing little to the improvement of the external coupling efficiency. The same is true of the bottom-emission type structure. This Embodiment is particularly effectively applied where the top-emission type structure is provided with a low refractive index layer such as gap 81.

That is, if we let the refractive index of the gap 81, which functions as a low refractive index layer, be $n_3$ and the refractive index of the organic layer 100 or emissive layer 102 be $n_e$, then the refractive indices are preferably set to $$n_1 > n_2 > n_3$$

and more preferably to $n_e > n_2$.

An emissive type display (OLED display) can be constructed by arranging the light-emitting devices of this Embodiment in matrix to form pixels which are individually switched on and off to display an image. Further, the light-emitting devices of this Embodiment can also be used as an illumination device. When the light-emitting devices are used as an illumination device, they may be turned on en masse over the entire surface of the illumination device. It is also possible to divide the illuminating area into smaller areas and allow individual areas to be switched on or off or adjusted in the quantity of light. When the light-emitting devices are used as an illumination device, the circular polarizer 710 need not be used.

The light-emitting devices of this Embodiment as used in an OLED display will be described.

First, a pixel structure in the OLED display of this Embodiment will be explained.

Figure 3:
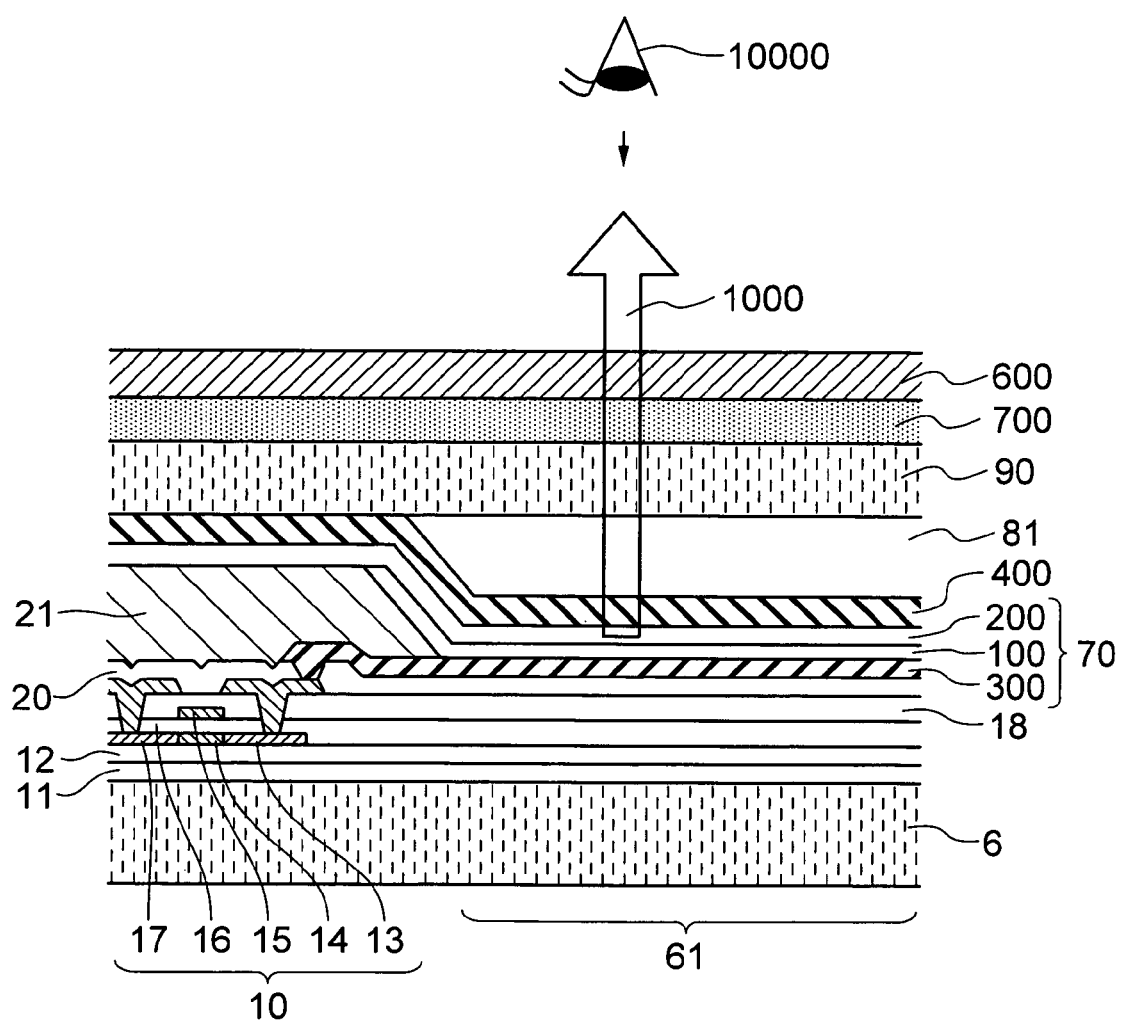
FIG. 3 is a cross-sectional view showing how an emissive type display (OLED display) using the light-emitting device of Embodiment 1 is implemented.
Figure 4:
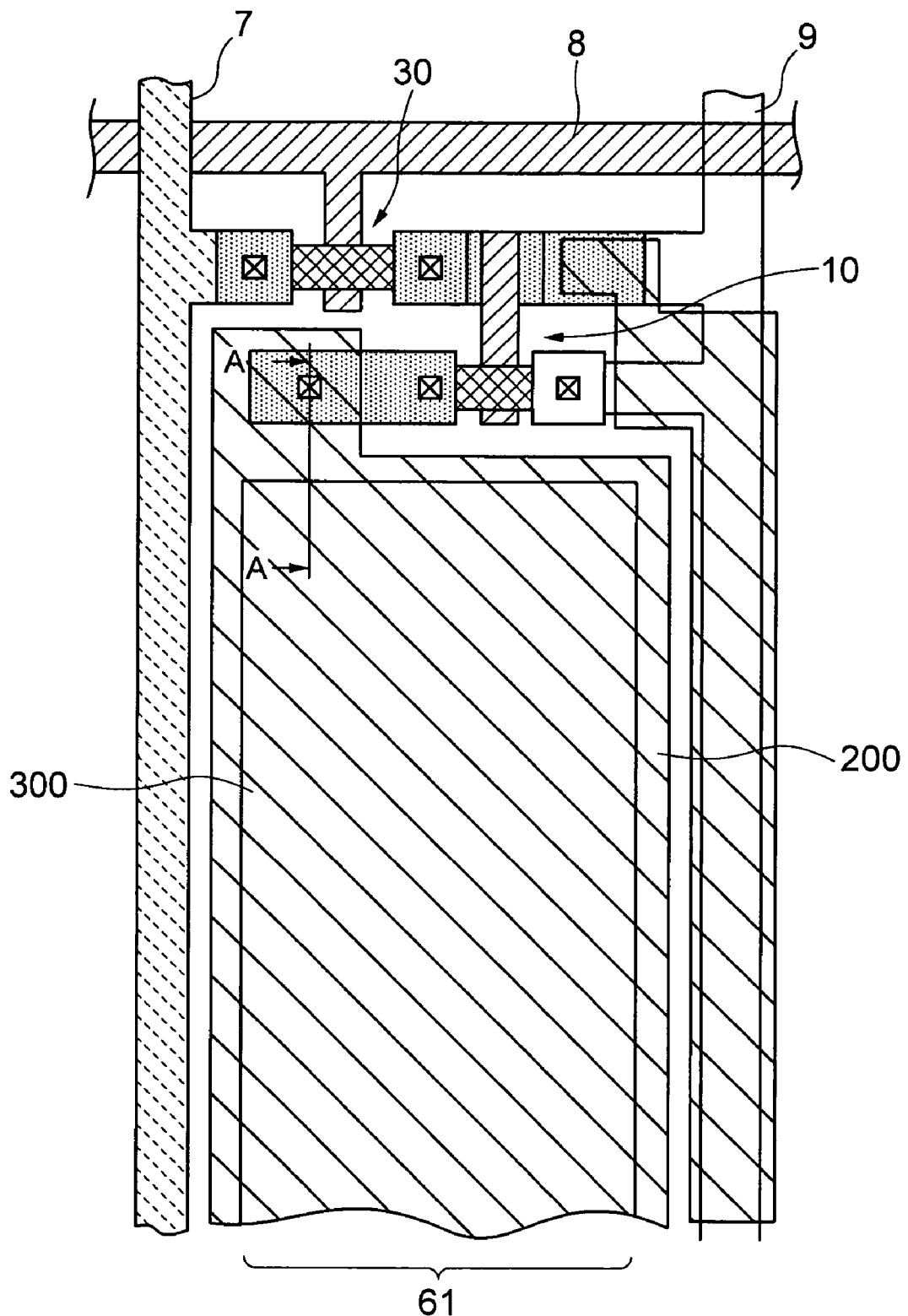
FIG. 4 is a front view showing how the OLED display using the light-emitting device of Embodiment 1 is implemented.
Figure 5:
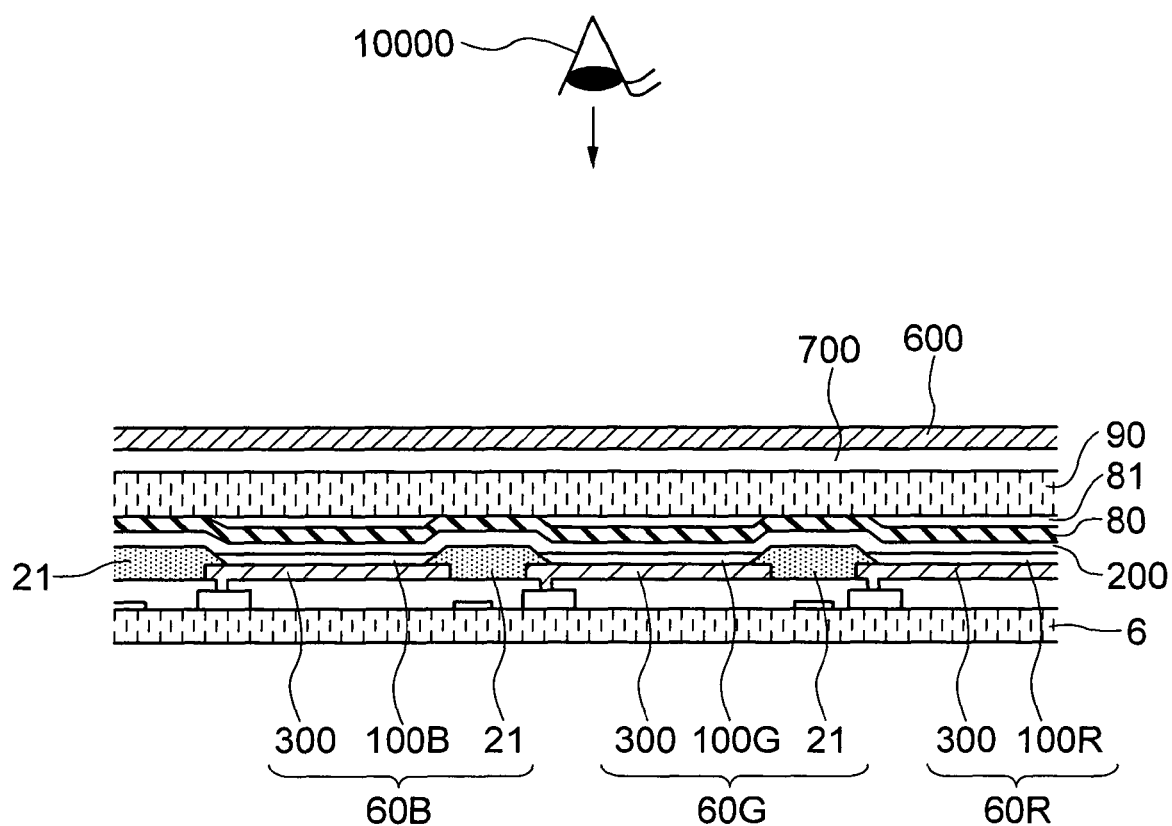
FIG. 5 is a cross-sectional view showing how the OLED display using the light-emitting device of Embodiment 1 is implemented.

FIG. 3 is a schematic cross-sectional view showing one pixel and its surrounding structure. FIG. 4 is a schematic plan view showing a part of a pixel structure as seen from above in the OLED display 1. FIG. 3 is a cross section taken along the line A-A' of FIG. 4. FIG. 5 is also a schematic cross-sectional view showing a part of the OLED display of this invention. In FIG. 5 a layer is shown divided into areas, one painted as an organic layer 100R for emitting a red light, one as an organic layer 100G for emitting a green light and one as an organic layer 100B for emitting a blue light. Three pixels—a red light emitting pixel 60R, a green light emitting pixel 60G and a blue light emitting pixel 60B—all arranged side by side constitute one color pixel and these rays of light emitted from the three pixels are additively mixed together to produce a desired color. These pixels 60R, 60G, 60B are also called unit pixels or subpixels and, in the case of a monochromatic display, the unit pixel constitutes one monochromatic pixel.

The OLED display of this Embodiment is an active-matrix drive type OLED display having switching devices formed of thin-film transistors and organic light-emitting diodes. This is a so-called top-emission type OLED display in which light is extracted from a side opposite a substrate 6 on which organic light-emitting diodes 70 are formed.

Referring to FIG. 3 and FIG. 4, the structure of one pixel and its surrounding in the OLED display will be explained. In this OLED display, switching devices formed of a thin-film transistor are provided on the substrate 6 of an insulative material, such as glass, whose surface is planar. Switching devices, such as driving transistors 10 and switching transistors 30, that form circuits of pixels are made of a polysilicon thin-film transistor. The polysilicon thin-film transistor has a gate insulating layer 16, a gate electrode layer 15, a first interlayer insulating layer 18, a source/drain electrode layer 19 and a second interlayer insulating layer 20, all formed over a polysilicon layer that includes source/drain regions 13, 17 and a channel polysilicon layer 14.

Between the polysilicon thin-film transistor and the substrate 6 there is a first foundation layer 11 formed of SiNx film to block mixing of ions, such as Na and K, from the substrate 6 into the polysilicon layer 14 and the gate insulating layer 16. Also between the first foundation layer 11 and the polysilicon layer a second foundation layer 12 of SiOx film is formed.

In the non-emissive region including the switching transistor 30, driving transistor 10, data line 7, gate line 8 and common potential line 9, a third interlayer insulating layer 21 is formed. Over a reflective electrode 300 that also serves as a light reflection surface, an organic layer 100 is formed so as to cover the pixel. Regions other than the emissive region 61 are isolated from the transparent electrode 200 by the third interlayer insulating layer 21.

Figure 6A:
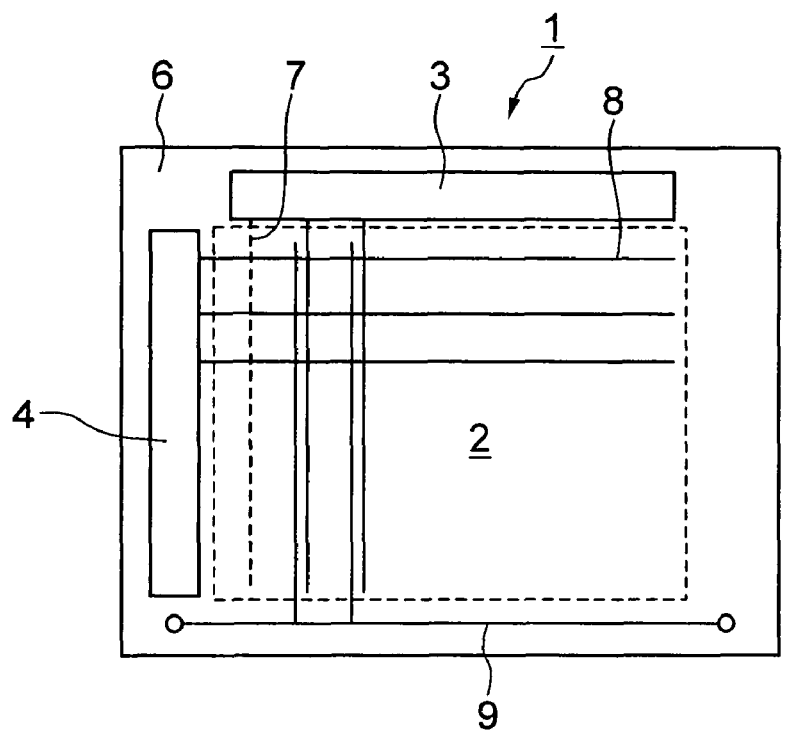
FIGS. 6A and 6B illustrate the entire OLED display using the light-emitting device of Embodiment 1.
Figure 6B:
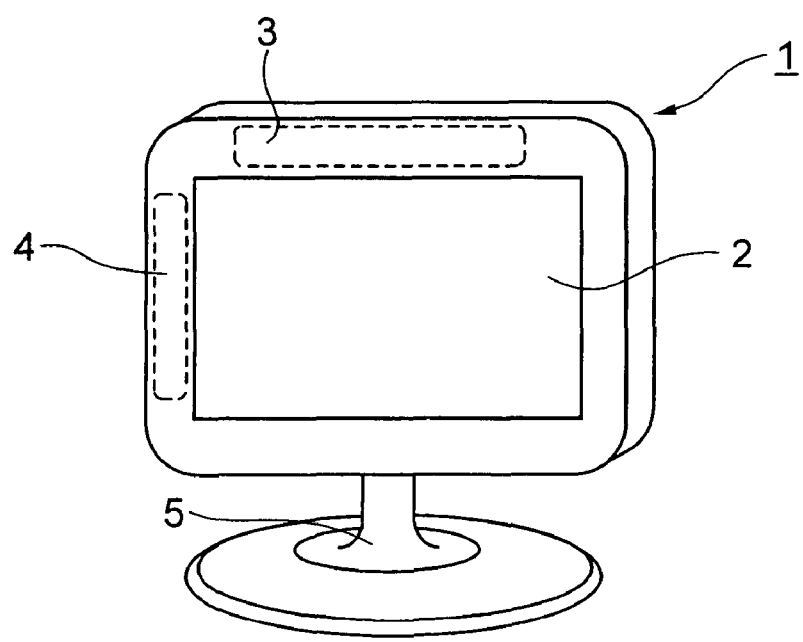
Figure 7:
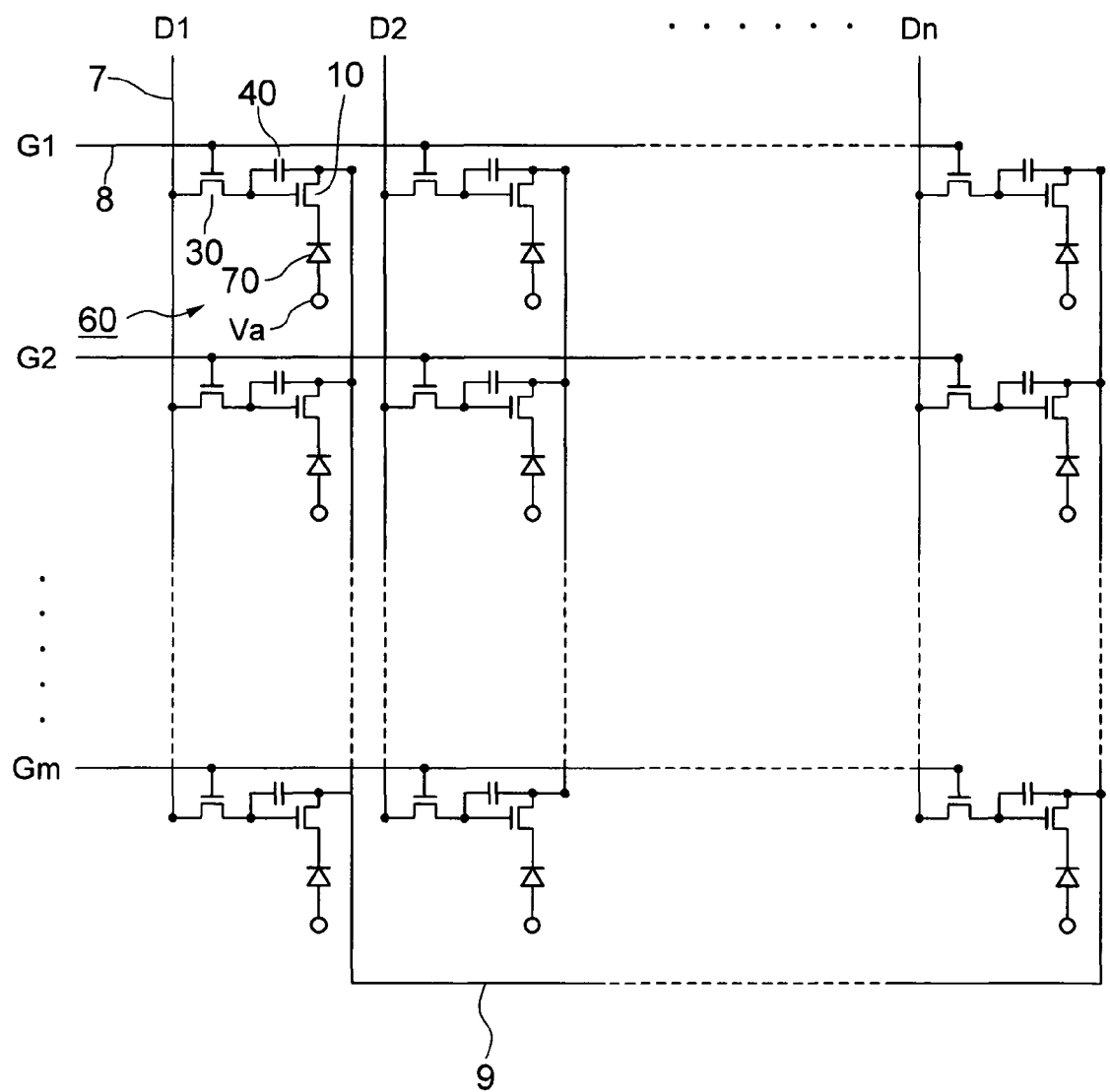
FIG. 7 illustrates an equivalent circuit of an active matrix of the OLED display using the light-emitting device of Embodiment 1.

FIGS. 6A and 6B are block diagram schematically showing an overall layout of the OLED display 1 and an illustration of display 1, respectively. FIG. 7 is an equivalent circuit of an active matrix formed in a display area 2 of the display 1.

As shown in FIG. 6A, the OLED display 1 has the display area 2 at an almost central part of a substrate 6 made of a transparent insulative material such as glass. Arranged on the top side of the display area 2 is a data drive circuit 3 that outputs an image signal to the data lines 7. On the left side of the display area 2 a scan drive circuit 4 is provided which outputs a scanning signal to the gate lines 8. These drive circuits 3, 4 are constructed of a shift register circuit, a level shifter circuit and an analog switch circuit, all being complementary circuits using N- and P-channel thin-film transistors (TFTs). The OLED display, as shown in FIG. 6B, is supported by a stay 5 and used as a monitor device for TV and computer images. It can also be used as a television receiver by incorporating a TV tuner in it.

Like an active matrix drive type liquid crystal display, the OLED display 1 has formed on the substrate 6 a plurality of gate lines and a plurality of data lines extending in a direction crossing the gate lines. As shown in FIG. 7, pixels 60 are arranged in matrix at intersections between m gate lines G1, G2, ..., Gm and n data lines D1, D2, ..., Dn.

Each of the pixels is made up of an organic light-emitting diode (OLED) 70, a storage capacitor 40, a switching transistor 30 formed of a P-channel TFT with its gate electrode connected to a gate line, one of its source and drain electrodes connected to a data line and the other connected to the storage capacitor 40, and a driving transistor 10 formed of an N-channel TFT with its gate electrode connected to the storage capacitor 40, its source electrode connected to a common potential line 9 extending in the same direction as the data line and its drain electrode connected to one electrode of the OLED 70. The other electrode of the OLED 70 is connected to a current supply line common to all pixels and kept at a constant voltage Va.

Next, the driving of each pixel will be explained by referring to FIG. 7. A turn-on voltage (scan signal) is successively supplied to gate lines of m rows in one frame period, beginning with a gate line G1 on a first row. When the switching transistor 30 is turned on by the scan signal, an image signal is written into the storage capacitor 40 from the data line through the switching transistor 30. That is, in this driving scheme, while the turn-on voltage is supplied to a gate line, all the switching transistors 30 connected to that gate line become conductive causing data voltages (corresponding to the image signals) to be supplied from n data lines.

The data voltages are stored in the storage capacitors 40 while the turn-on voltage is supplied to the gate line. A gate electrode of the driving transistor 10 is held at a potential almost equivalent to the image signal by the storage capacitor 40 for one frame period even after the switching transistor 30 is turned off. The voltage of the storage capacitor 40 defines the gate voltage of the driving transistor 10, which in turn controls a current flowing through the driving transistor 10 and therefore the illumination of the OLED 70. The illumination is stopped by turning off the driving transistor 10.

In other words, in synchronism with the turn-on voltage being applied to the gate lines associated with those pixels that need to be controlled in the quantity of light produced, a voltage corresponding to the image information is applied to the pixels to control the quantity of light produced in the pixels. Thus, by controlling the quantity of light produced in a plurality of pixels making up the display area 2 according to the image information, a desired image can be displayed. A response time it takes from when the current has passed through the OLED until the OLED begins to emit light is normally less than 1 μs, so a rapid-moving image can be displayed without delay.

For the transparent electrode 200 that functions as an anode, a transparent electrode material with a high work function, such as ITO (indium tin oxide), may be used. InZnO may also be used.

For the reflective electrode 300 that functions as a cathode, materials with a low work function such as Al, Mg, Mg—Ag alloy and Al—Li alloy may be used. If the reflective electrode 300 is made of Al alone, the drive voltage becomes high and the electrode's longevity short. It is therefore advisable to insert a very thin Li alloy (e.g., lithium oxide $Li_2O$ and lithium fluoride LiF) between the reflective electrode 300 and the organic layer 100 to produce a characteristic equal to that of an Al—Li alloy. It is also possible to dope that part of the organic layer 100 contacting the cathode with a highly reactive metal, such as lithium and strontium, to lower the drive voltage. The reflective electrode 300 is preferably formed of a material with a high light reflectivity to efficiently extract light emitted from the organic layer 100 outward. Further, it is also desired that the reflective electrode 300 have a reflective mirror surface that reflects an incident circularly polarized light as an outgoing circularly polarized light rotating in a reverse direction. This helps reduce the reflection of ambient light and improve a light utilization or an efficiency of extracting the light emitted from the organic layer 100 outward of the display, i.e., toward an observer 10000 side.

In this Embodiment, the reflective electrode 300 also functions as a reflective surface provided at the back of the organic layer 100 in addition to the electrode and thus doubles as a reflective layer and an electrode layer. Rather than having the reflective electrode 300 serve as both the reflective layer and the electrode layer, it is also possible to put at the position of the reflective electrode 300 a transparent electrode made of a transparent conductive material with its work function properly controlled and then to provide at the back of the transparent electrode a reflective metal layer or dielectric multilayer that functions as light reflection surface.

The organic layer 100 making up the OLED 70 may be formed as a laminated layer between the anode and the cathode which consists of, from the cathode side, an electron transporting layer 101, an emissive layer 102 and a hole transporting layer 103. The organic layer 100 can also be formed in a four-layer structure in which a hole injecting layer is provided between the anode and the hole transporting layer or in a two-layer structure in which the emissive layer and the electron transporting layer are formed as a single layer.

When a DC voltage is applied between the transparent electrode 200 and the reflective electrode 300, holes injected from the transparent electrode 200 move through the hole transporting layer 103 to the emissive layer 102 and electrons injected from the reflective electrode 300 move through the electron transporting layer 101 to the emissive layer 102, where the holes and the electrons recombine to produce light of a wavelength corresponding to a particular color. In this Embodiment, to realize a full-color emissive type display (OLED display), an emissive thin film that forms pixels arranged in matrix and which emits red, green or blue light is painted in different colors in a predetermined order. That is, the organic layer 100 including the emissive thin film which has three primary color areas—red, green and blue areas— arranged in a predetermined order for each pixel (in FIG. 5, 100R, 100G and 100B) is painted in different colors.

A red emissive thin film may use the following material for example. The hole transporting layer may be formed of α-NPD (4-4'-bis [N-(1-naphthyl)-N-phenylamino]biphenyl) and triphenyldiamine derivatives TPD (N,N'-bis(3-methylphenyl)-N,N'-diphenyl-[1,1'-biphenyl]-4,4'-diamine). The electron transporting emissive layer (which doubles as an electron transporting layer and an emissive layer) may be formed of Alq3 (tris(8-quinolinolate)aluminum) dispersed with DCM-1 (4-dicyanomethylene-6-(p-dimethylaminostyryl)-2-methyl-4H-pyran).

As a material for a green emissive thin film, the hole transporting layer may be formed of α-NPD and triphenyldiamine derivatives TPD; and the electron transporting emissive layer (which doubles as an electron transporting layer and an emissive layer) may be formed of Alq3, Bebq (bis(8-hydroxy quinolinate)beryllium) and Alq3 doped with quinacridone.

As a material for a blue emissive thin film, the hole transporting layer may be formed of α-NPD and triphenyldiamine derivatives TPD; the emissive layer may be formed of DPVBi (4,4'-bis(2,2-diphenylvinyl) biphenyl), a combination of DPVBi and BCzVBi (4,4'-bis(2-carbazolevinylene)biphenyl), or distyrylallylene derivatives as a host doped with distyrylamine derivatives as a guest; and the electron transporting layer may be formed of Alq3. The electron transporting emissive layer (which doubles as an electron transporting layer and an emissive layer) can use Zn(oxz)2 (zinc complex of 2-(o-hydroxyphenyl)benzoxazole).

In addition to the above small molecular materials, polymer materials may also be used. For example, a laminated layer of PEDT/PSS (a mixed layer of polyethylene dioxythiophene and polystyrene sulphonate) and PPV (poly(p-phenylene vinylen)) can be used for the hole transporting layer and the emissive layer. A green light emission can be realized by mixing a green ink with PPV and a red light can be produced by mixing a green ink with Rhodamine as a red light emission dopant. The blue emissive layer may use F8 (poly (dioctylfluorene)). F8 can also function as an electron transporting layer. Other polymer materials include a polymer containing colorant, such as PVK (poly(N-vinylcarbozole).

In the case of a small molecular material, the painting of the organic layers 100R, 100G, 100B in three different colors can be achieved by a known selective deposition method for organic layer that uses a shadow mask vacuum evaporation technique. In this process, the third interlayer insulating layer 21 can be used as an abutment member for the shadow mask.

When the emissive layer 102 is made of a polymer material, a known ink jet patterning technique can be used. In this process, the third interlayer insulating layer 21 can be made to function as a bank separating the pixel areas.

The emissive layer 102 may use a phosphorent type emissive material and another emissive material called a triplet emissive material with a high luminous efficiency. In producing excitons, a triplet excited state has a high occurrence probability statistically, so that the luminous efficiency of the phosphorent type emissive material is high. The phosphorent type emissive material is realized by using a heavy metal complex with Ir and Pt as a host. Currently, while a high luminous efficiency can be obtained with green and red materials, there is no blue material available that has as high a luminous efficiency as the green and red materials. Thus, when for example we attempt to produce a white color by using a phosphorent type emissive material for emissive thin films forming red, green and blue pixels, it is necessary to reduce the light intensity of red and green to a level of blue with low luminous efficiency. Therefore, a bright white color cannot be produced even when the red and green material have high luminous efficiencies.

On the other hand, when we attempt to improve the external coupling efficiency by using a nano-structure layer 400 as in this Embodiment, the nano-structure layer 400 has a great effect of improving the external coupling efficiency particularly for light of short wavelengths. That is, by improving the external coupling efficiency of blue light in particular, the application of a phosphorent type emissive material to red and green pixels can realize an emissive type display that can produce a bright white color taking advantage of the high luminous efficiency of the phosphorent type emissive material. Further, this method improves a balance among red, green and blue lights extracted from the display toward an observer, further enhancing the brightness of white color thanks to the high luminous efficiency of the phosphorent type emissive material.

In either case, each of the layers making up the organic layer 100 is thin, about several tens of nm in thickness, leaving the polarization of light passing through them almost intact.

Over the entire organic layer 100 is formed the transparent electrode 200 which is connected to a current supply line not shown.

The nano-structure layer 400 of this Embodiment was formed by applying a hydrophilic coat and heating it to harden.

The hydrophilic coat hardens quickly near its surface upon being heated, after which, when a solvent of the coating material inside the coat surface evaporates, it cannot pass through the hardened surface of the coat, forming minute pores in the coating material. These minute pores contribute to scattering of the guided mode light.

Now, the process of forming the nano-structure layer 400 is explained below.

Prior to applying a coating material, a base material, over which the nano-structure layer 400 will be formed, is processed first, as by being applied with ultraviolet light or an oxygen plasma, or left standing in an oxygen plasma environment or in an ozone environment to improve a wettability of the surface of the base material. In this Embodiment, since the nano-structure layer 400 is formed over the transparent electrode 200, the transparent electrode 200 serves as the base material. Alternatively, a very thin resin layer may be formed to improve the adhesion with the nano-structure layer 400. The resin layer may use polycarbonate, PMMA and hydrocarbon resin such as polyethylene and polypropylene. As for an ultraviolet light irradiation, while ultraviolet light may be produced by a high voltage mercury lamp or ultrahigh voltage mercury lamp, it is effective to use a deep UV lamp and low voltage mercury lamp that irradiate ultraviolet light of 254 nm and 185 nm that can easily produce ozone. This process is intended to reduce the contact angle between the base material and water, which is preferably set below 70° or 50°. During the irradiation of ultraviolet light, the base material may be heated. When a resin is used for the base material, it is desired that the heating temperature be set to around a deflection temperature under load of the resin (more specifically to ±20° C.). When a resin base material is used, heating can improve the hardening of the nano-structure layer 400. Next, a hydrophilic coating material is applied by an ordinary coating method, such as a dip coating, spin coating, spray coating and bar coating.

The hydrophilic coating material is made up of a hydrophilic material, a retaining material for holding the hydrophilic material, and a solvent.

(1) Hydrophilic Materials

Possible hydrophilic materials include organic high molecular materials, such as polyethylene glycol and polyvinyl alcohol, and inorganic materials, such as hydrophilic alumina particles and hydrophilic silica particles or titania particles. Of these, the inorganic materials, i.e., hydrophilic alumina particles and hydrophilic silica particles, are superior to others, considering the fact that a material that does not dissolve if immersed in water for a long period can retain hydrophilicity (these inorganic materials become inorganic oxides). Further, these inorganic particles are often dispersed in water and, as coating materials, have a high water content, so that when applied to the surface of the base material and dried, the inorganic particles may be repelled on the base material surface. This is because water has a surface tension of 72 mN/m, larger than those of general organic solvents. Thus, the film forming ability can be enhanced by using those materials with a small surface tension of 20-30 mN/m such as alcohol and ethylmethyl ketone rather than water as a dispersing solvent. Hydrophilic silica particles are particularly preferred for the hydrophilic material used in this invention since they can be dispersed in an organic solvent such as alcohol ethylmethyl ketone.

(2) Retaining Materials

Among the possible retaining materials are organic high molecular materials such as polyethylene glycol and polyvinyl alcohol, organic materials which, when heated, polymerize to become retainers, such as acrylamide and materials which, when heated, become inorganic retainers, such as silica sol. Of these, acrylamide, silica sol and titania are superior because the materials that do not dissolve if immersed in water for a long period can retain hydrophilicity. Further, in terms of a matching or compatibility between the hydrophilic material and the retainer, silica sol is particularly preferable for inorganic hydrophilic materials.

Silica sol is made by heating alkoxysilane either in water that becomes acid by dilute hydrochloric acid, dilute nitric acid or dilute phosphoric acid or in water-alcohol mixture to cause it to self-polymerize to have a molecular weight of a few thousand. Alkoxysilane includes methyltrimethoxysilane, ethyltrimethoxysilane, butyltrimethoxysilane, tetramethoxysilane and tetraethoxysilane. Instead of alkoxysilane, alkoxytitanium may be used if there is a compatibility in liquid property and solvent. Alkoxytitanium includes tetra-i-propyltitanate, tetra-n-butyltitanate, tetrastearyltitanate, triethanolaminetitanate, titaniumacetylacetonate, titaniumethylacetoacetate, titaniumlactate, and tetraoctileneglycoltitanate. It is also possible to use a few polymerized molecules of these compounds.

The same retaining performance of the above silica sol can be obtained when alkoxysilane having amino groups is used in stead of silica sol. Subjecting alkoxysilane to an acid gas can cause amino groups to change into an ammonium salt structure, further improving the hydrophilicity of the film. Such materials include N-(2-aminoethyl)-3-aminopropylmethyldimethoxysilane, 3-aminopropyltriethoxysilane and 3-aminopropyltrimethoxysilane.

(3) Solvents

Solvents to be used preferably have good matching (dispersibility and compatibility) with the hydrophilic and retaining materials and easily evaporate when hot-cured. In particular, to form pores in the hydrophilic coat, it is desired that the boiling point of the solvent be lower than a heat curing temperature. Of the above hydrophilic materials, alcohol-based solvent is preferred since it can disperse well hydrophilic alumina particles and hydrophilic silica particles, both having high durability. Furthermore, because of their high compatibility with silica sol, which is a suitable retaining material, the alcohol-based solvents, such as methanol, ethanol, n-propanol and isopropanol, are preferred.

After being applied with the above hydrophilic coating material, the base material is heated. This causes pores to be formed in the hydrophilic coat. In hardening the coat, the coat surface is quickly heated at a curing temperature, allowing pores to be more easily formed.

Further, a water repellent coat may be formed over the hydrophilic coat. For instance, the water repellent coat can be made by forming a monomolecular layer of fluorine-containing compound. Because of its lubricating characteristic, the water repellent coat can improve a rubbing resistance.

An examination of a cross section of a formed hydrophilic coat found that pores 10-200 nm in size are formed in the coat and that the pores occupy more than 80% of the volume of the hydrophilic coat. Therefore, when silica particles are used, the average refractive index can be changed in a range of between 1.1 and 1.5. When titania particles are used, it can be changed in a range of 1.24 to 2.2.

The nano-structure layer 400 used in this Embodiment contains fine air pores therein and thus has a smaller refractive index than those of the hydrophilic material and retaining material. By controlling the size of pores, the nano-structure layer 400 can be made almost transparent at a visible wavelength and made to have a light scattering capability in the range of ultraviolet wavelength.

Further, since the nano-structure layer 400 of this Embodiment can be formed at low temperatures, it can be formed over the transparent electrode 200 after the organic layer 100 has been fabricated, without damaging the organic layer 100. Thus, the nano-structure layer 400 is suited for an OLED of top-emission structure.

The nano-structure layer 400 of this Embodiment improved the external coupling efficiency by more than 1.5 times or, depending on the conditions, by more than two times. That is, a transmission loss in the transparent electrode 200 and the organic layer 100 when the nano-structure layer 400 is formed is more than 0.6 dB or, depending on the conditions, more than 1.3 dB for one pixel length. The length of each pixel considered here is taken to be that of its longer side. In 100 ppi, for example, the pixel size is about 250 µm. This means that the nano-structure layer 400 to be used needs to be such that the transmission loss of the emissive layer 102 with the nano-structure layer 400 formed over the transparent electrode 200 is more than 24 dB/cm or preferably 52 dB/cm.

Further, since the nano-structure layer 400 has a level of refractive index intermediate between those of the transparent electrode 200 or organic layer 100 and the gap 81, it also helps prevent the reflection of emitted light or ambient light 908 from the organic layer 100, thus improving the transmissivity for the transmitted light 900 from the organic layer 100, which in turn contributes to improving the external coupling efficiency.

When a layer of medium 2 with a refractive index $n_2$ is provided between a layer of medium 1 of a refractive index $n_1$ and a layer of medium 3 of a refractive index $n_3$ to reduce the reflectivity, the reflectivity can be most reduced by setting the refractive index of medium 2 to $$n_2 = \sqrt{n_1 n_3} \tag{7}$$

and also setting the thickness t of the medium 2 to $$t = \frac{\lambda}{4n_2} \tag{8}$$

To lower the reflectivity in the entire visible wavelength range, a wavelength λ to be used in the above Equation needs to be near the middle of the visible wavelength range. Thus the possible wavelength to be adopted is around 510 nm to 580 nm. In this Embodiment, if the reflection on the surface of the transparent electrode 200 is to be reduced, the transparent electrode 200 corresponds to the medium 1, the gap 81 to the medium 3, and the nano-structure layer 400 to the medium 2. Thus, when it is necessary to prevent the reflection, it is desired that the refractive index $n_2$ of the nano-structure layer 400 be set to between about 1.3 and 1.41 and the thickness to around 90-110 nm. Therefore, to produce the effect of improving the external coupling efficiency and reducing the reflectivity, the range of feasible and preferred refractive index in the nano-structure layer 400 of this Embodiment is between 1.1 and 1.41 or between 1.1 and 1.3. In this range of refractive index, it is preferred to set the thickness of the nano-structure layer 400 to 90-140 nm.

It is desired that the nano-structure layer 400 have a large difference in refractive index between the base material and fine particles or pores to increase light scattering. The nano-structure layer 400 also preferably has a small average refractive index. Thus, for an improved external coupling efficiency, the base material used preferably has a high refractive index. For example, an organic material with as high a refractive index as 2, such as $TiO_2$ may be used. Alternatively, when the base material has a refractive index less than 2, it is possible to mix nano particles of high refractive index, such as $TiO_2$, to increase the refractive index.

The nano-structure layer 400 is characterized by its hydrophilicity and surface resistivity of less than $1 \times 10^{11} \Omega$. Hence, the surface is hardly charged electrically, preventing dust from adhering to the surface during the manufacturing process and thus improving reliability and yield.

On the light extraction side of the OLED 70, a quarter wave plate 700 and a polarizer 600 are formed one upon the other. The polarizer 600 and the quarter wave plate 700 make up a so-called circular polarizer 710 arranged to cover the entire surface of at least the display area 2. The polarizer 600 passes linearly polarized light, whose polarization axis lies in a particular direction, and absorbs linearly polarized light whose polarization axis is perpendicular to the first axis. The quarter wave plate 700 has a function of shifting the phase of the linearly polarized light that has passed through the polarizer 600 by π/2 to transform the linearly polarized light into circularly polarized light.

The polarizer 600 may be made by having iodine or dichroic dye adsorbed on a polyvinyl alcohol-based polymer film, stretching it so that the film has a polarization function, and then bonding a transparent protective layer, such as triacetylcellulose, to one or both sides of the film.

For the quarter wave plate 700, a retardation film can be used which is made by stretching a transparent polymer film by an appropriate means. The polymer film need only be able to be given an optical anisotropy through stretching and may use polyvinyl alcohol, polycarbonate, polysulfone, polystyrene, polyarylate and norbornene.

Generally, a retardation film has a wavelength dependency of refractive index, so it is difficult to produce a phase difference of ¼ wavelength by a single retardation film for rays of light with a wide range of wavelength, such as ambient light, including sunlight and illumination, and white light. To counter this problem, the quarter wave plate for producing a phase difference of ¼ wavelength over a wide range of wavelength may be formed by a method that stacks two different retardation films with different wavelength dependencies of refractive index (wavelength dispersions) in such a manner that their slow axes cross each other at right angles, or by a method that stacks a retardation film having a phase difference of ¼ wavelength and at least one retardation film having a phase difference of ½ wavelength in such a way that their slow axes cross each other. In the latter method, the use of a retardation film with a small wavelength dependency of refractive index, e.g., a film made of amorphous olefin polymer, can realize a more ideal quarter wave plate.

To realize a circular polarizer that functions as a quarter wave plate and produces a high reflection prevention effect in a wide range of view angle, it is advisable to use a lamination of biaxial retardation films.

The quarter wave plate may be constructed of a birefringence layer made of liquid crystalline compound or a lamination of the birefringence layer and a retardation film. The liquid crystalline compound may use a barlike liquid crystalline compound. This liquid crystalline compound, while in a homogeneously aligned state, is fixed by a polymerization reaction to form a birefringence layer. In this case, because the birefringence layer made of liquid crystalline compound can be made as thin as a few μm, a quarter wave plate thinner than the laminated structure of retardation films can be realized.

Figure 2:
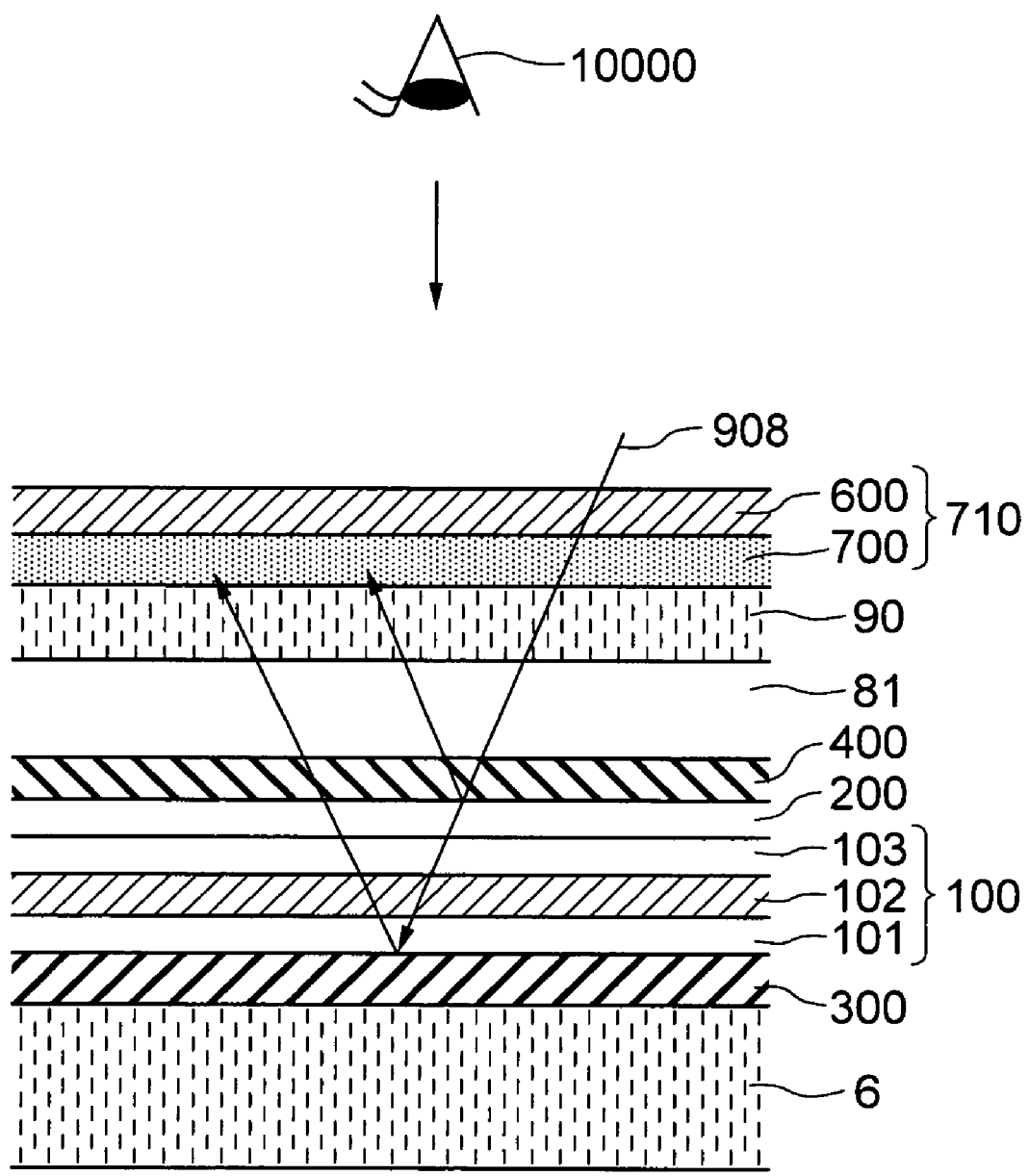
FIG. 2 is a cross-sectional view showing ambient light incident on the light-emitting device of Embodiment 1.

Now, referring to FIG. 2, effects that the circular polarizer 710 has on ambient light 908 and characteristics of the nano-structure layer 400 will be explained. If the ambient light 908 incident on the display area 2 is reflected by the surface and interfaces of layers, a contrast is reduced. Particularly because the reflectivity of the reflective electrode 300 is high, the reflection by this electrode greatly reduces the contrast. Further, in the top-emission type structure, since the transparent electrode 200 has a high refractive index with respect to the gap 81, there is a significant effect of this surface reflection on the contrast. In this Embodiment the circular polarizer 710 is used to minimize the contrast reduction caused by these reflections. About half of the ambient light is absorbed by the circular polarizer 710 and the remaining half becomes circularly polarized light and passes through the circular polarizer 710. Light reflected by the surface, interfaces and the reflective electrode 300 is circularly polarized in a direction opposite that of the incoming circularly polarized light and is therefore absorbed by the circular polarizer 710 and does not come out. On the other hand, since light emitted from the organic layer 100 is not polarized, about half of this light is absorbed by the circular polarizer 710 and the remaining half becomes circularly polarized light and thus passes through the circular polarizer 710, contributing to the image display.

As described above, to minimize a contrast reduction caused by ambient light reflection, the nano-structure layer 400 must also reflect and transmit the ambient light 908 without affecting its polarization. To that end, the nano-structure layer 400 must have as weak a scattering effect on the ambient light 908 as will not destroy the circularly polarized state.

As described above, the nano-structure layer 400 of this Embodiment has a weak scattering effect on transmitted light 900 of visible wavelength which is emitted from the organic layer 100. This means that the nano-structure layer 400 also has a small scattering effect on the ambient light 908 of visible wavelength. However, the nano-structure layer 400 has a large scattering effect on the evanescent wave in the waveguided light 904. This indicates that the nano-structure layer 400 greatly scatters the ambient light 908 of ultraviolet wavelength. Therefore, the desirable characteristic of the nano-structure layer 400 is that it has a small scattering effect and is transparent for ambient light 908 but greatly scatters light of ultraviolet wavelength.

Visible wavelengths are generally in the range of about 380-780 nm and thus the ultraviolet wavelength is taken to be less than about 380 nm.

The scattering capability of the nano-structure layer 400 for visible wavelength and ultraviolet wavelength can be evaluated according to changes in a degree of polarization of the ambient light 908 that is polarized upon entering the layer. That is, it is desired that, for the visible wavelength, the nano-structure layer 400 have as small a polarization nullifying effect as will not cause any significant reduction in contrast and that, for near ultraviolet wavelength, the layer 400 produce a large scattering effect as there is no need to maintain the polarized state of light. The scattering of visible light poses a problem of a contrast reduction particularly at a wavelength of 555 nm where a spectral luminous efficiency is high. At this wavelength it is desired that the scattering after light has passed through the nano-structure layer 400 once (i.e., haze value) be between 0% and 1% and more preferably less than 0.2%. Reducing the light scattering in this way can more than halve the contrast reduction.

Since the refractive index of ITO is around 2, the wavelength of evanescent wave running into the nano-structure layer 400 is, from Equation (1), about half that of the wavelength in vacuum. Therefore, the wavelength of the evanescent light is about 190-390 nm, which is shorter than the visible wavelength. Thus, the nano-structure layer 400 is preferably constructed such that after ultraviolet light passes through the nano-structure layer 400 once in a wavelength range of between 380 nm, a boundary between ultraviolet wavelength and visible wavelength, and 190 nm or one-half the 380 nm wavelength, light scattering of more than 1% or more preferably more than 5% occurs.

Normally, the organic layer 100 is susceptible to degradation by water contained in air. Thus, it is desired that the organic layer 100 be hermetically sealed with a transparent sealing plate 90.

Materials for the transparent sealing plate 90 include a glass plate, a polymer film treated with gas barrier processing, and a thin glass plate laminated with a resin film. The polymer film may use a polycarbonate film formed by a casting method, a polymer film such as triacetylcellulose, and an optically isotropic plastic sheet or film such as aliperiodic acryl resin formed by injection molding. When a polymer film or a resin plate is used, the transparent sealing plate 90 must be provided with a gas barrier capability by subjecting the sealing plate to the gas barrier treatment to form a gas barrier layer. Alternatively, the polymer film or resin plate may be bonded with a glass sheet about several tens of μm to give it the gas barrier capability. It is noted that the transparent sealing plate 90 is preferred to be optically isotropic.

In this Embodiment, with a third interlayer insulating layer 21 used as a spacer, the transparent sealing plate 90, which is transparent to visible light and has a gas barrier capability, and the substrate 6 are fixed by an adhesive sealing agent that is applied in a framelike configuration to the periphery of the display area of the display. Alternatively, the transparent sealing plate 90 and the substrate 6 may be hermetically sealed with an adhesive sealing agent which is mixed with a spacer material, such as beads and rods, and applied in a framelike configuration to the periphery of the display area of the display.

Between the transparent sealing plate 90 and the light scattering material, a gap 81 with a refractive index almost equal to that of air is preferably provided. The gap 81 is preferably sealed with an inert gas such as nitrogen gas. This can be realized by filling a nitrogen gas into the gap and hermetically bonding the transparent sealing plate 90 and the substrate 6 when the two members are fixed. Further, it is preferred that a desiccant be provided as required between the transparent sealing plate 90 and the substrate 6 at positions that do not interfere with the display area 2. The nano-structure layer 400 used in this Embodiment is a hydrophilic porous layer and thus can be provided with a function of desiccant.

On the transparent sealing plate 90 are arranged a quarter wave plate 700 and a polarizer 600. The quarter wave plate 700 and the polarizer 600 are bonded with an acrylic transparent adhesive. It is possible to eliminate the transparent sealing plate 90 if both or one of the quarter wave plate 700 and the polarizer 600 is given a sufficient gas barrier performance.

Alternatively, the sealing member may be constructed by forming a layer having a higher refractive index than that of the transparent electrode 200 and a high gas barrier performance directly on the transparent electrode 200. When the sealing member is not used and the gap 81 not formed, air on the light extraction side can be regarded as a low refractive index layer.

Further, the transparent sealing plate 90 may be hermetically sealed over the entire surface to prevent an ingress of air. In this case, the gap 81 may be filled with a transparent member whose refractive index is smaller than that of the nano-structure layer 400. To make the refractive index smaller than that of the nano-structure layer 400, it is desired to use a nano-structure layer having a different pore factor or pore size from that of the nano-structure layer 400. By filling the gap 81 the strength of the OLED display can be improved.

As described above, the display of this invention can efficiently utilize light, that has conventionally been lost through propagation, as extracted light. Thus, for the same power consumption, a brighter display can be realized. Or at the same brightness, electric current flowing through light-emitting devices can be reduced, which in turn reduces a power consumption, realizing a display with a longer life.

While in this Embodiment the same nano-structure layer 400 is used over the entire display area, the size of the nano-structure may be changed according to the wavelength of emitted light from each pixel to further improve the external coupling efficiency.

Although the OLED display of active matrix drive has been described as one Embodiment, this invention is not limited to this example. That is, this invention can also be applied to an OLED display of simple matrix drive which drives the light-emitting devices of this invention by directly connecting their electrodes to vertical scan lines and horizontal scan lines, without using switching devices such as thin-film transistors.

Further, this invention can also be applied to so-called multi-photon devices as OLED devices, in which a plurality of OLED units are stacked together. The multi-photon device is described, for example, in J. Kido et al, "High Efficiency Organic EL Devices having Charge Generation Layers," 2003 SID International Symposium DIGEST p 964-965 (2003). In the multi-photon device, a light extraction layer may be provided on an uppermost transparent electrode.

Embodiment 2

Figure 8:
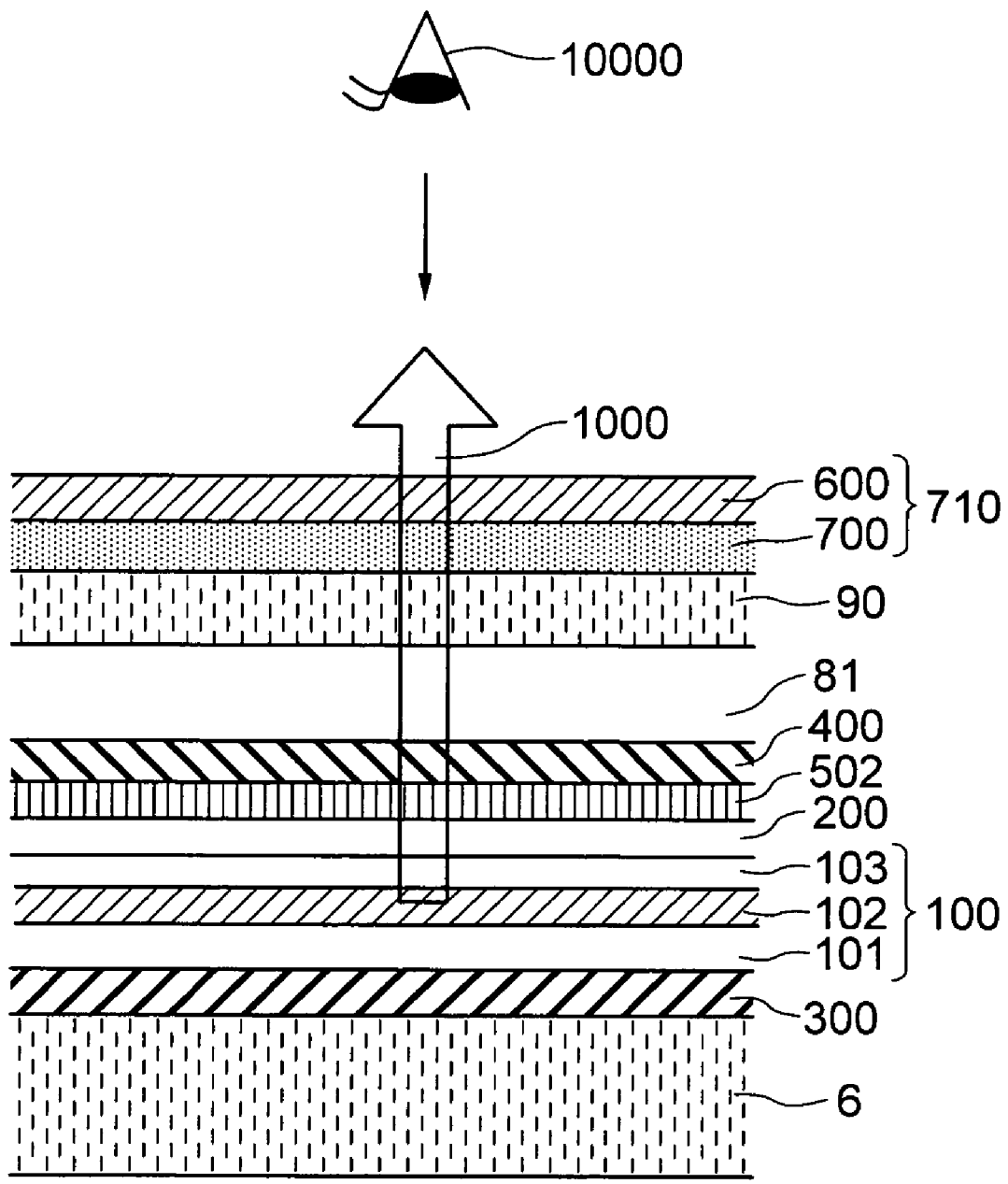
FIG. 8 is a cross-sectional view showing how a light-emitting device of this Embodiment is implemented (Embodiment 2).

FIG. 8 is a cross-sectional view of a light-emitting device according to one Embodiment of this invention.

In the light-emitting device of this Embodiment, an organic layer 100 constituting an OLED device is formed over a reflective electrode 300, and a transparent electrode 200 is formed over the organic layer 100. Over the transparent electrode 200 are formed a high refractive index layer 502 and a nano-structure layer 400 that functions as a light extraction layer. The organic layer 100 is hermetically sealed by a transparent sealing plate 90, with a gap 81 formed between the transparent sealing plate 90 and the nano-structure layer 400. On the transparent sealing plate 90 is provided a circular polarizer 710 which prevents ambient light 908 reflected by the reflective electrode 300 and interfaces from coming out. When the light-emitting devices of this Embodiment are used in an emissive type display, a contrast reduction can be prevented.

The nano-structure layer 400 of this Embodiment is the same as Embodiment 1, except that a high refractive index layer 502 is provided between the nano-structure layer 400 and the transparent electrode 200 to improve the external coupling efficiency. The material used for the high refractive index layer 502 has a higher refractive index than that of the transparent electrode 200. A part of the light emitted from the organic layer 100 passes through the transparent electrode 200 and goes out as extracted light 1000 from the light-emitting device. The remaining light is trapped and guided in the transparent electrode 200, the organic layer 100 and the high refractive index layer 502. At this time, since the refractive index of the high refractive index layer 502 is higher than that of the transparent electrode 200, the field strength of the guided light intensifies in the high refractive index layer 502. By forming the high refractive index layer 502 thin, the field strength of evanescent light running into the nano-structure layer 400 can be made stronger than when the high refractive index layer 502 is not used. Therefore, the intensity of light scattered by the nano-structure layer 400 increases, thus improving the percentage of light to be extracted. That is, in this Embodiment, a ratio of scattering cross section between the transmitted light 900 and the evanescent guided light is approximately $(n_2/n_1)^4$, so increasing $n_1$ and intensifying the field strength for light guiding in the high refractive index layer 502 can further improve the external coupling efficiency.

Further, since the waveguided light 904 is strongly trapped in the high refractive index layer 502, the field strengths in the organic layer 100 and the reflective electrode 300 weaken, reducing the light absorbing effect of the organic layer 100 and reflective electrode 300. This reduction in light absorption contributes to improving the external coupling efficiency.

If we let the refractive indices of the organic layer 100, transparent electrode 200, high refractive index layer 502 and nano-structure layer 400 be $n_e$, $n_1$, $n_2$ and $n_3$, it is desired that these refractive indices meet the following conditions:

$n_1 < n_2$ $n_e > n_3$

The high refractive index layer 502 may be a uniform layer or one with a light scattering ability. If the high refractive index layer 502 is to be given the light scattering ability, it is desired that, for light passing through the layer, the layer exhibit as small a scattering effect and be as transparent as will leave the polarization of the light intact. For the waveguided light, the high refractive index layer 502 preferably exhibits such a strong light scattering ability as will contribute to the improvement of the external coupling efficiency.

In this Embodiment, since $TiO_2$ layer is used for the high refractive index layer 502, its refractive index is set to 2.2-2.5. Other preferred layers for the high refractive index layer 502 include ZnS, ZnO and SiN layers. It is possible to disperse fine particles of $SiO_2$ in these layers to give them the light scattering ability. Alternatively, fine particles of $TiO_2$ may be dispersed in a resin with a high refractive index to enhance an average refractive index of the layer. In that case, it is preferred to use a resin material with a refractive index of more than 1.7 so that the average refractive index can be increased to 2.0 or higher by mixing minute particles such as $TiO_2$ in the resin.

It is desired that the high refractive index layer 502 be formed thinner than a combined thickness of the transparent electrode 200 and the organic layer 100. More preferably, the layer 502 has a smaller thickness than that of the transparent electrode 200. Therefore, the high refractive index layer 502 preferably has a thickness of 0.1-10 μm and more preferably 0.1-0.5 μm.

Alternatively, instead of the high refractive index layer 502, it is effective to use a thin metal layer with a light transmitting capability. This is because surface plasmon produced in the metal layer causes the electric field to strongly couple with the metal layer. In this case, the metal layer is preferably set to 5-50 nm in thickness so as to produce a light transmitting capability, and it is preferable to use a gold or silver thin layer so that the surface plasmon can be produced easily.

In this Embodiment, the use of the high refractive index layer 502 can reduce the penetration depth expressed by Equation (4). This in turn makes it unnecessary to provide the gap 81 even if the nano-structure layer 400 is formed thin. Therefore, the gap 81 can be filled with a material of a higher refraction index than that of the nano-structure layer 400. Or the transparent sealing plate 90 may be securely bonded directly to the nano-structure layer 400. This Embodiment is not limited to the top-emission type structure but can also be applied to the bottom-emission type structure. In the bottom-emission type structure, the nano-structure layer 400, the high refractive index layer 502, the transparent electrode 200, the organic layer 100 and the reflective electrode 300 may be arranged in that order from the substrate 6 side. It is also possible to insert layers having other functions between these layers.

As in the first and the following Embodiments, an OLED display can be constructed by arranging light-emitting devices of this Embodiment in matrix to form pixels and switching individual pixels on and off to display an image. Further, the light-emitting devices can also be used as an illumination device. When used as an illumination device, all the light-emitting devices over the entire surface may be turned on simultaneously. In this case, the switching devices and the circular polarizer 710 may be eliminated.

Embodiment 3

Figure 9:
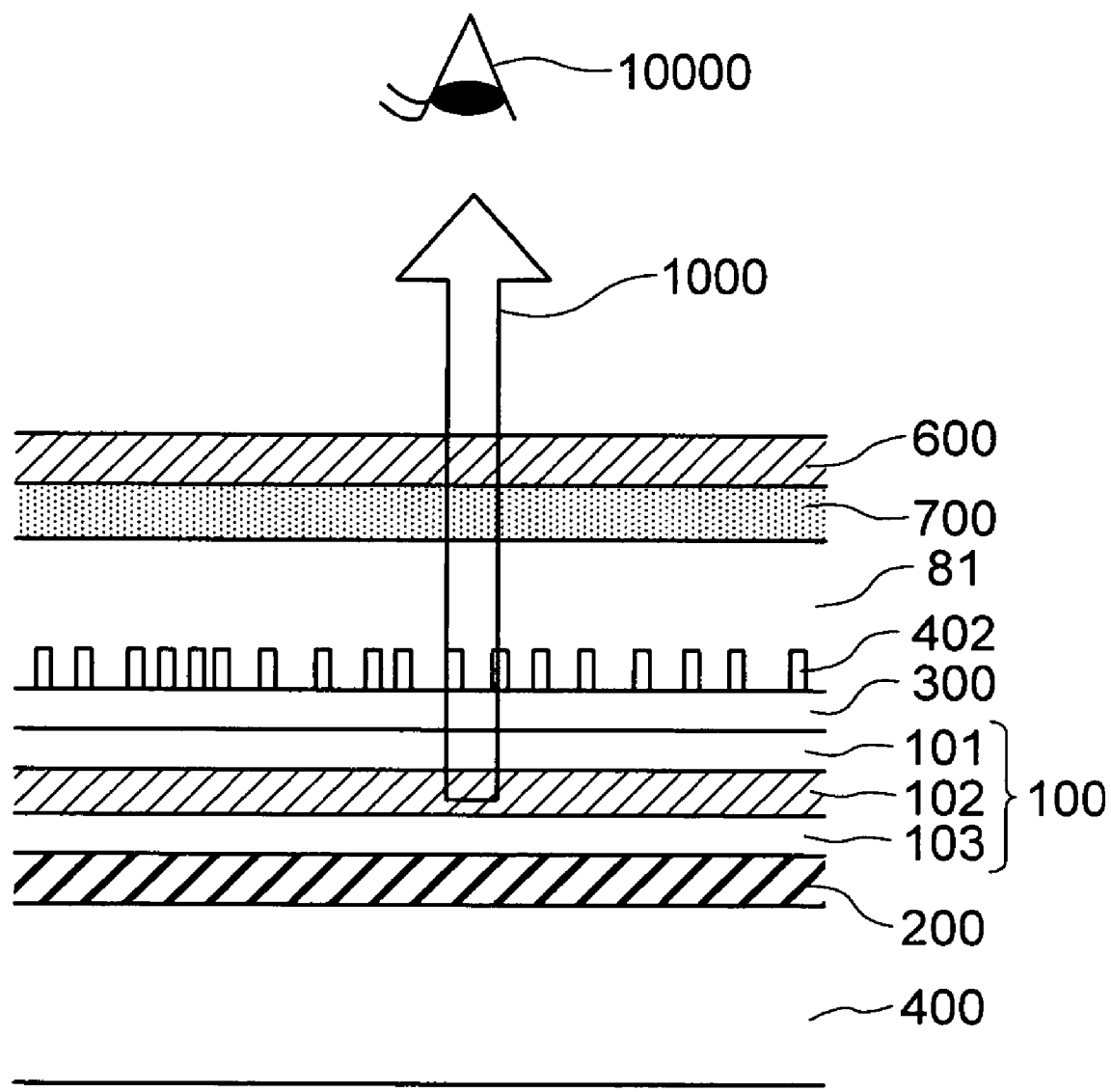
FIG. 9 is a cross-sectional view showing how a light-emitting device of this Embodiment is implemented (Embodiment 3).

FIG. 9 shows a cross section of a light-emitting device as one Embodiment of this invention.

The light-emitting device of this Embodiment has formed on the reflective electrode 300 an organic layer 100 constituting an organic light-emitting diode (OLED), on which a transparent electrode 200 is formed. Further, over the transparent electrode 200 is formed a rodlike nano-structure layer 402 that functions as a light extraction layer. The organic layer 100 is hermetically sealed with a transparent sealing plate 90, with a gap 81 formed between the transparent sealing plate 90 and the rodlike nano-structure layer 402. On the transparent sealing plate 90 is arranged a circular polarizer 710 that prevents ambient light 908 reflected by the reflective electrode 300 from going out of the device and thereby minimizes a reduction in contrast when the light-emitting device of this Embodiment is used in the OLED display.

The rodlike nano-structure layer 402 of this Embodiment uses nano-size pillar structures that are randomly arranged to function as a light scattering layer for waveguided light 904. A part of the light emitted from the organic layer 100 passes through the transparent electrode 200 and goes out from the light-emitting device as transmitted light 900. The remaining light propagates trapped in the transparent electrode 200 and the organic layer 100. Of the waveguided light, evanescent light leaking into the rodlike nano-structure layer 402 is scattered before going out as extracted light 1000.

To increase the intensity of light scattering by the rodlike nano-structure layer 402, the pillar structures preferably have a high refractive index. To that end an inorganic layer with a high refractive index such as $TiO_2$ may be used. To improve the refractive index of the rodlike nano-structure layer 402, a medium of a high refractive index may be mixed with fine particles of even higher refractive index. Mixing the fine particles increases an average refractive index and the fine particles function as a scattering material for the evanescent wave. It is preferred to mix fine particles such as $TiO_2$ in a resin of refractive index of more than 1.7 to obtain a resin material that has a refractive index higher than that of the transparent electrode 200 or organic layer 100. This renders the fabrication of the rodlike nano-structure layer 402 easy. Further, the pillar structure of the rodlike nano-structure layer 402 also functions as a waveguide structure to guide scattered rays of light toward the front side. Therefore, making the pillar structure smaller or larger toward the front end can improve the brightness on the front side of the display by the scattered light.

It is desired, as in Embodiment 1, that the rodlike nano-structure layer 402 exhibit a small scattering effect on, and be transparent to, visible wavelength and have a strong scattering effect on ultraviolet wavelength. Thus, the pillar structure preferably has a diameter of less than 100 nm and more preferably less than 50 nm. It is also preferred that the rodlike nano-structure layer 402 have a small average refractive index. The average refractive index can be determined by controlling the density of the rodlike structures. In the rodlike nano-structure layer 402, to set the average refractive index in a rage of 1.1-1.3, 1.1-1.41 or 1.1-1.5 to reduce the reflectivity, the density of the rodlike structures is preferably set to between 10% and 41% or more preferably less than 30%.

For the manufacture of the rodlike structure of this Embodiment, a so-called nano-imprint that is made by pressing a mold formed with a fine pattern against a resin layer was used. The rodlike nano-structure layer 402 has a nano-size pillar structure, so when the mold is removed, the pillar structure is stretched. Therefore, the pillar structure can be made more fine than the size of the mold. Alternatively, when an inorganic material is used, a photolithography method may be used to form pillars by etching.

In this Embodiment, since the light scattering intensity and the average refractive index can be controlled by the shape, refractive index and density of the pillar structure, the rodlike nano-structure layer with desired characteristics can be designed easily and stably.

Although in this Embodiment the pillar structure has been described, the nano-structure layer is not limited to the pillar-shape structure and may be formed in a pyramid structure. It is also possible to form holes in the layer to realize the light scattering capability and a low refractive index.

Embodiment 4

Figure 10:
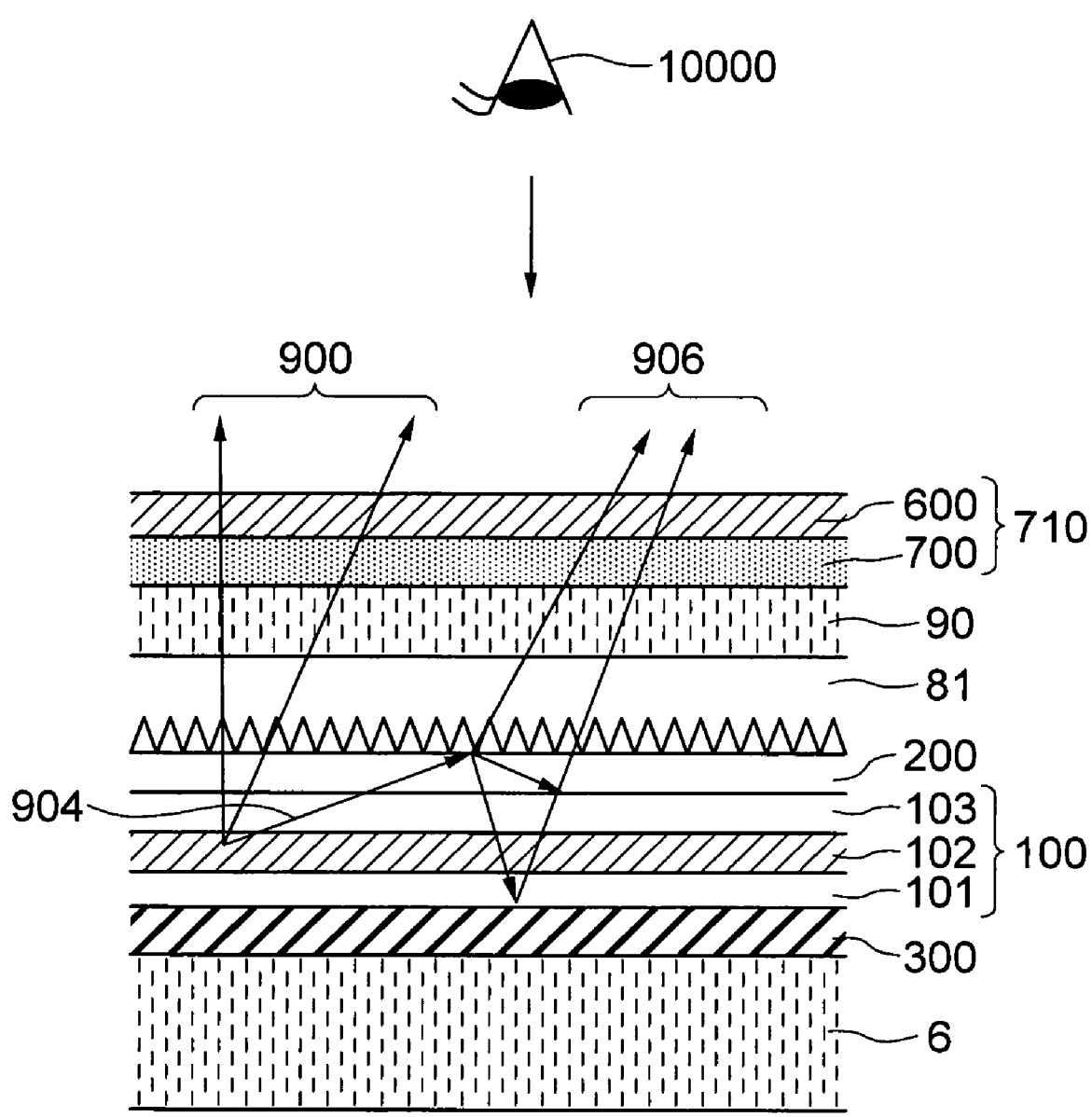
FIG. 10 is a cross-sectional view showing how a light-emitting device of this Embodiment is implemented (Embodiment 4).

FIG. 10 shows a cross section of a light-emitting device as one Embodiment of this invention.

The light-emitting device of this Embodiment has formed on the reflective electrode 300 an organic layer 100 constituting an organic light-emitting diode (OLED), on which a transparent electrode 200 is formed. Further, over the transparent electrode 200 is formed a periodic structure layer 410 that functions as a light extraction layer. The organic layer 100 is hermetically sealed with a transparent sealing plate 90, with a gap 81 formed between the transparent sealing plate 90 and the periodic structure layer 410. On the transparent sealing plate 90 is arranged a circular polarizer 710 that prevents ambient light 908 reflected by the reflective electrode 300 and interfaces from going out of the device and thereby minimizes a reduction in contrast when the light-emitting device of this Embodiment is used in the OLED display.

In this Embodiment, when ambient light reflected by the periodic structure layer or grating 410 is diffracted, a polarization of light is destroyed lowering contrast. Thus, the grating 410 is formed as a layer having a periodic structure smaller than the wavelength of light emitted from the emissive layer so as to prevent reflection and diffraction. Further, the waveguided light 904 that is trapped and guided in the transparent electrode 200 and the organic layer 100 can be diffracted by the grating 410 for extraction through transmission or reflection.

Next, the conditions of the grating 410 that does not reflect or diffract the ambient light of visible wavelength but diffracts the waveguided light 904 for extraction are given below. If we let a refractive index of a first medium be $n_1$ and a refractive index of a second medium be $n_2$, a diffraction angle θ at which light of wavelength λ, that has entered the periodic structure of a period d at an incidence angle i from a medium j, is diffracted in a medium k is given by $$n_j \sin i + n_k \sin\theta = \frac{m\lambda}{d} \quad (9)$$

where m is an order of diffraction. In this Embodiment the transparent electrode 200 is the first medium (refractive index $n_1$) and the gap 81 is the second medium (refractive index $n_2$).

From these Equations, the condition under which the ambient light of wavelength λ is not reflection-diffracted by the periodic structure is $$d < \lambda/2n_2 \quad (10)$$

In this condition, those of light rays from the organic layer 100 which pass through the transparent electrode 200 when the periodic structure is not provided, can pass through the grating 410 without being affected. So, it is possible to extract a quantity of light equal to or more than that when no grating 410 is provided. Next, the condition under which light propagating in the first medium is diffracted by the grating 410 and appears as the transmission-diffracted light on the second medium side is $$\frac{\lambda}{n_2 d} - \frac{n_2}{n_1}\sin i < 1 \quad (11)$$

Further, the condition under which light propagating in the first medium is reflection-diffracted by the grating 410 toward the first medium to change its propagation angle is $$\frac{\lambda}{n_1 d} - \sin i < 1 \quad (12)$$

Since the light reflection-diffracted by the grating 410 toward the first medium changes its propagation angle, it is reflected mainly by the reflective electrode 300 after being diffracted and can be extracted through the transparent electrode 200.

In this Embodiment $n_1 > n_2$, so considering the above condition, the ambient light of wavelength can be prevented from being reflection-diffracted by the periodic structure and the polarization of the reflected light can be protected against being destroyed, by choosing the period d of the grating 410 such that the following condition is met:

$$\frac{\lambda}{2n_1} < d < \frac{\lambda}{2n_2} \quad (13)$$

Further, those of light rays from the organic layer 100 which pass through the transparent electrode 200 when the grating 410 is not provided, can also pass through the periodic structure without being affected as if there was no periodic structure. The waveguided light, on the other hand, is diffracted by the grating 410 to be transmitted or reflected for extraction through the transparent electrode 200, thus improving the external coupling efficiency.

It is particularly desirable to set the period d of the grating 410 to $$\frac{\lambda}{n_1 + n_2} < d < \frac{\lambda}{2n_2} \quad (14)$$

because the waveguided light is both transmission-diffracted and reflection-diffracted, greatly contributing to the improvement of the external coupling efficiency through diffraction. It is noted that the external coupling efficiency for the waveguided light can also be improved by the reflective diffraction for the following case:

$$\frac{\lambda}{2n_1} < d < \frac{\lambda}{n_1 + n_2} \quad (15)$$

In this Embodiment in particular, since the gap 81 is provided, $n_2 = 1$ needs to be substituted in the above Equation. If the ITO's refractive index of 1.8-2.1 is used for $n_1$, the period d is then set to 175 nm to 200 nm and the wavelength will be 350-700 nm or 400-800 nm covering nearly the entire range of visible wavelength. Therefore, when the grating 410 of uniform period is to be formed over the entire surface, the period d is preferably set to 175 nm to 200 nm. With the period of grating determined in this way, the periodic structure layer works as the grating 410 for ultraviolet ambient light and reflection-diffracts it. That is, the periodic structure layer of this Embodiment functions as a medium having an average refractive index for reflected ambient light in a roughly visible wavelength range and as a grating for reflected ambient light at near ultraviolet wavelength.

It is also possible to change the period d according to the pixel color. In that case, since a wavelength that appears red ranges from 570 nm to 780 nm, green ranges from 500 nm to 570 nm and blue ranges from 380 nm to 500 nm, it is desired that the period d of grating be set to 195 nm to 390 nm for R pixels, 142 nm to 250 nm for G pixels and 125 nm to 190 nm for B pixels. Alternatively, the period may be changed only for R pixels with those for B and G pixels set equal. In that case, the periods for the B and G pixels are preferably set to 142-190 nm and that for R pixels to 195-210 nm. As described above, by choosing an appropriate period for R pixels, the visible light that is diffracted by the grating 410 in the R pixels becomes less than 420 nm, whose spectral luminous efficiency is small.

As described above, the provision of the gap 81 decreases $n_2$, making it possible to use a grating 410 of a large period d according to Equation (15). The large period renders the manufacture of the grating 410 easy.

The periodic structure of this Embodiment is made by using a two-beam laser interference method which involves dividing an exposure laser beam into two luminous fluxes and radiating these luminous fluxes against the photosensitive material at an angle to form a periodic structure pattern on a photosensitive material. The photosensitive material may use a resist that changes its solubility according to light exposure. For example, azo dye polymer that changes its surface configuration according to light exposure may be used. When the period of grating is changed according to RGB, the radiation angle of two luminous fluxes or a laser beam wavelength needs to be changed.

Instead of the two-beam laser interference method, a photomask may be used to expose the pattern. The periodic structure can also be fabricated by using a so-called nano-imprint that transfers the pattern onto a resin by pressing a mold against it. With these techniques, a two-dimensional periodic structure having two periodic structures in two directions can be realized. In this case, the two periods in two directions need to satisfy the above-described period of grating.

The grating 410 of this Embodiment does not diffract the ambient light of visible wavelength and thus has a reflection prevention effect on the visible wavelength light. To increase the reflection prevention effect, it is desired the width of the periodic structure be progressively reduced from the transparent electrode 200 toward the gap 81 so that the average refractive index will change gradually. That is, for producing the reflection prevention effect, the material used to form the periodic structure layer preferably has a refractive index close to that of the transparent electrode 200. It is also preferred that the aspect ratio of the periodic structure be more than 2.

Rather than providing the gap 81, it may be filled with a material of low refractive index which is then bonded with the transparent sealing plate 90. Let $n_e$ denote the refractive index of the organic layer 100 and $n_2$ the refractive index of the low refractive index material. It is desired that the following condition be met:

$n_e > n_2$

As described above, the low refractive index material preferably has a small refractive index and the hydrophilic layer of low refractive index used in Embodiment 1 is suited. If the gap 81 is filled with a low refractive index material, this invention is not limited to the top-emission type structure of this Embodiment but can also be applied to the bottom-emission type structure.

Further, the diffraction efficiency can be improved by forming a thin metal layer over the periodic structure layer to take advantage of a propagation by surface plasmon. In this case, to make the surface plasmon more likely to occur, it is desirable to use a thin foil of gold or silver 5-50 nm thick.

Embodiment 5

Figure 11:
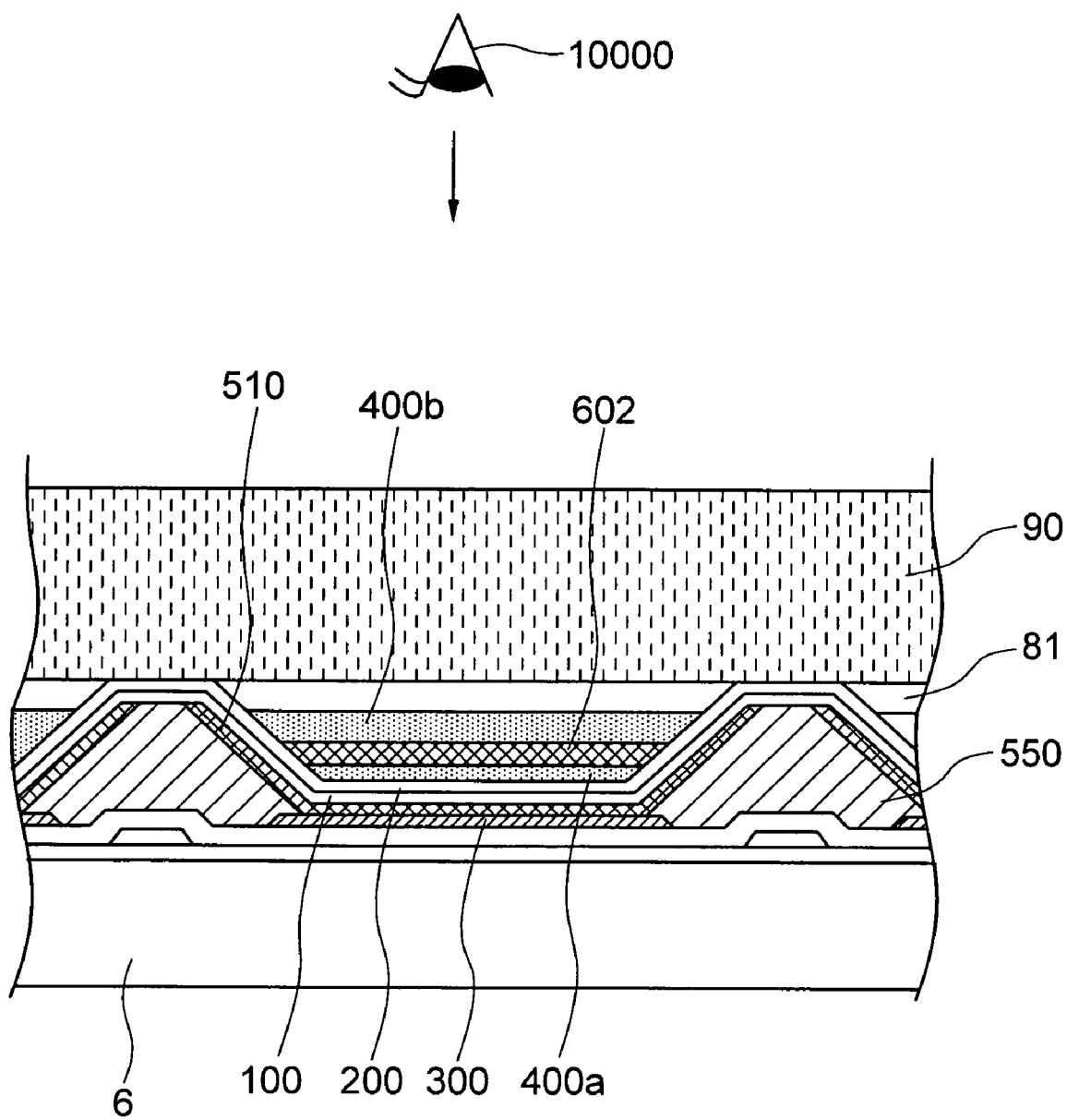
FIG. 11 is a cross-sectional view showing how an OLED display of this Embodiment is implemented (Embodiment 5).

FIG. 11 shows a cross section of an OLED display according to one Embodiment of this invention.

The OLED display of this Embodiment is characterized in that the entire organic layer, which in Embodiment 1 is painted in three different areas, red light emitting pixel areas, green light emitting pixel areas and blue light emitting pixel areas, is all used as a blue light emitting organic layer, and that a color changing layer that emits a red fluorescence upon receiving blue light and a color changing layer that emits a green fluorescence upon receiving blue light are provided at positions in the waveguide layer that correspond to the red and blue light emitting pixels. Several methods have been proposed and demonstrated which give the OLED display a full-color display capability. One such method (CCM method) combines blue light emitting pixels and fluorescent color changing mediums (CCM). The CCM method excites the color changing fluorescent dye layer by the light emitted from the blue light emissive layer to turn blue light into green light and red light, thus producing light of three primary colors (see Journal of Information & Picture Media Society, Vol. 54, No. 8, pp 1115-1120).

This Embodiment applies the CCM method to the display of this invention. As to the blue light emitting pixels, the nano-structure layer 400 is formed over the transparent electrode 200 as in the first Embodiment. As for the red and green light emitting pixels, a first nano-structure layer 400a, a color changing layer 602 and a second nano-structure layer 400b are stacked one upon the other in that order in a depressed area enclosed by a raised portion 550, as shown in FIG. 11.

The light emitted from the organic layer 100 propagates in the transparent electrode 200 and the organic layer 100 and produces evanescent waves in the first nano-structure layer 400a. The evanescent waves are scattered by the first nano-structure layer 400a and extracted into the color changing layer 602. The color changing layer 602 changes blue light produced by the organic layer 100 into a desired color. The light produced in the color changing layer 602 goes out in random directions, so a part of the emitted light is guided in the color changing layer 602. This waveguided light is then scattered by the first nano-structure layer 400a and the second nano-structure layer 400b for external extraction.

In this Embodiment, the raised portion 550 has a role of separating pixels from adjoining pixels when the color changing layer 602 is painted in different colors according to pixel positions. It also has an effect of separating individual pixels and preventing a degradation of picture quality, such as optical crosstalk and pixel color bleeding, that would result when light exiting from the color changing layer 602 leaks into adjoining pixels from which it goes out toward an observer 1000.

The effect of scattering evanescent waves by the nano-structure layer 400 increases as the wavelength decreases, so the nano-structure layer 400 exhibits a large scattering effect for blue light. That is, as in this Embodiment, by forming the entire organic layer as a blue light emitting organic layer, the blue light external coupling efficiency can be improved. This blue light with an improved external coupling efficiency is used to excite the green and red color changing layers 602, which improves the overall brightness of the display. The first nano-structure layer 400a need only be formed in one and the same specification for all pixels and thus can be made as by applying a coating over the entire display area.

In the same way that the gap 81 is provided over the second nano-structure layer 400b, a low refractive index layer with a lower refractive index than those of the first nano-structure layer 400a and the color changing layer 602 may be formed between the first nano-structure layer 400a and the color changing layer 602. This low refractive index layer may be made by increasing the pore factor in the nano-structure layer 400 or by having the pore factor in the nano-structure layer 400 increase toward the top.

Further, if the optical coupling between the transparent electrode 200 and the color changing layer 602 is sufficiently large, there is no need to use the first nano-structure layer 400a between the color changing layer 602 and the transparent electrode 200.

Embodiment 6

Figure 12:
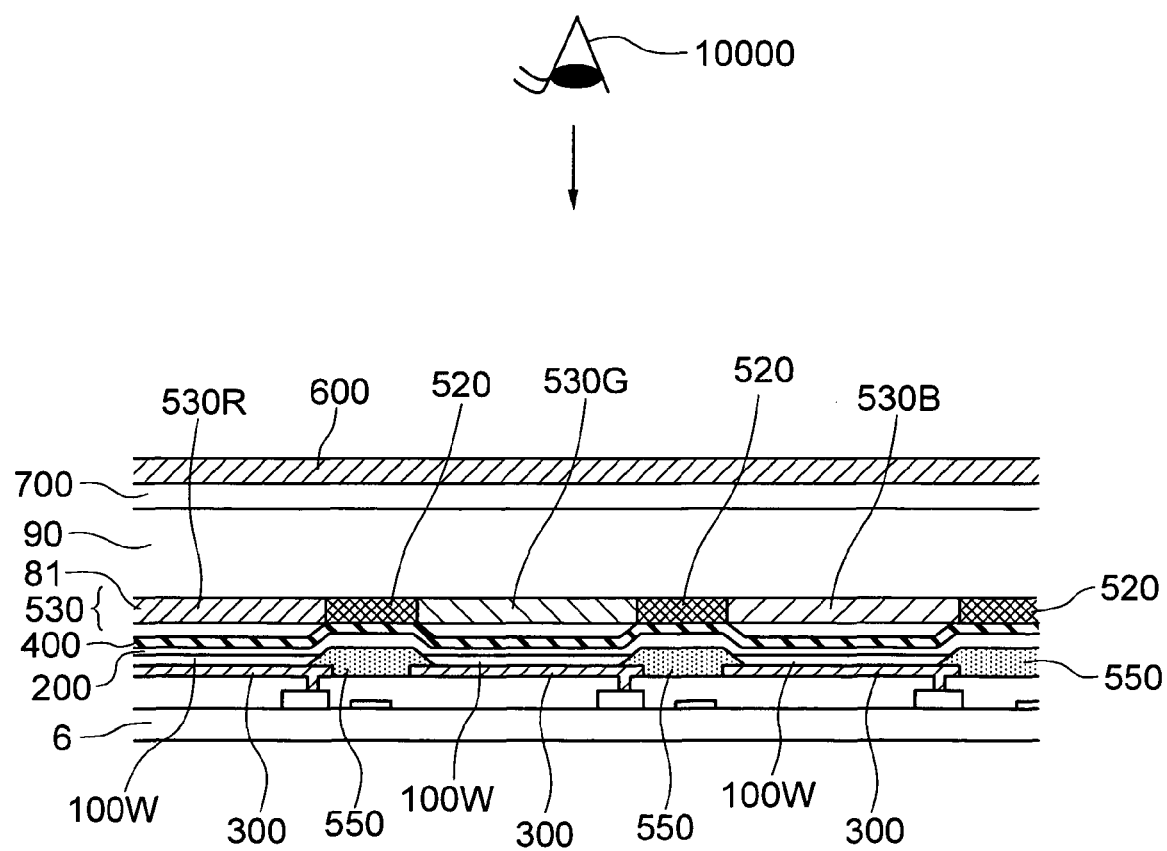
FIG. 12 is a cross-sectional view showing how an OLED display of this Embodiment is implemented (Embodiment 6).

FIG. 12 is a cross section of an OLED display according to one Embodiment of this invention.

This OLED display differs from the preceding Embodiments in that the light produced in an organic layer 100W is white and that the display has color filters 530R, 530G and 530B.

As shown in FIG. 12, the entire organic layer 100 is used as an organic layer 100W for emitting white light and the transparent sealing plate 90 is coated with different color filters 530R, 530G, 530B that transmit light corresponding to red, green and blue. A nano-structure layer 400 was formed over the transparent electrode 200 to improve the external coupling efficiency of light emitted from the organic layer 100W. The methods for realizing the white light emitting thin layer include one which has a plurality of laminated layers that emit different colors of light and one which has a single emissive layer doped with dyes that produce different colors of light. The former may, for example, use a combination of TPD, Alq3 partly doped with nile red and 1,2,4-triazole derivatives (TAZ). The latter may use PVK doped with three kinds of dyes or coloring matters, e.g., 1,1,4,4-tetraphenyl-1,3-butadiene (TPB), coumarin 6 and DCM1. In either case, it is possible to use the white light emitting organic layer 100W that has a high light emitting efficiency and a long life.

The color filters are made by forming over the transparent sealing plate 90 a pattern of black matrix 520 of chromium metal, chromium oxide or photosensitive resin dispersed with light absorbing pigments and then painting the patterned transparent sealing plate in three different colors at different positions by the known technique, such as a dyeing method, a pigment-dispersed photolithography method or a printing method, so that the color filters can pass red, green and blue light and absorb light of other colors.

The transparent sealing plate 90 formed with the color filters 530R, 530G, 530B is so positioned that its painted color filters almost align in position with the organic layer 100W forming the pixels before being fixed to the substrate 6.

Although in this Embodiment the organic layer 100 is formed as a white light emitting organic layer 100W, this invention is not limited to this configuration. That is, in red pixels, an organic layer 100 that emits red light may be formed and a red light transmitting color filter 530R arranged. In green pixels, an organic layer 100 that emits green light may be formed and then a green light transmitting color filter 530G formed. In blue pixels, an organic layer 100 that emits blue light may be formed and then a blue light transmitting color filter 530B formed. In that case, the light emitted from the organic layer 100 and absorbed by the color filters decreases, thus realizing an OLED display with a high light utilization factor.

The white light emitting organic layer 100W allows the use of a light emitting material with a high light producing efficiency and a long life. Further, since the external coupling efficiency is improved in this Embodiment, the current density applied to the OLED diode can be reduced, further prolonging the life of the OLED diode.

When the color filters are not provided in this Embodiment, the display can suitably be used as an illumination device.

Embodiment 7

Figure 13:
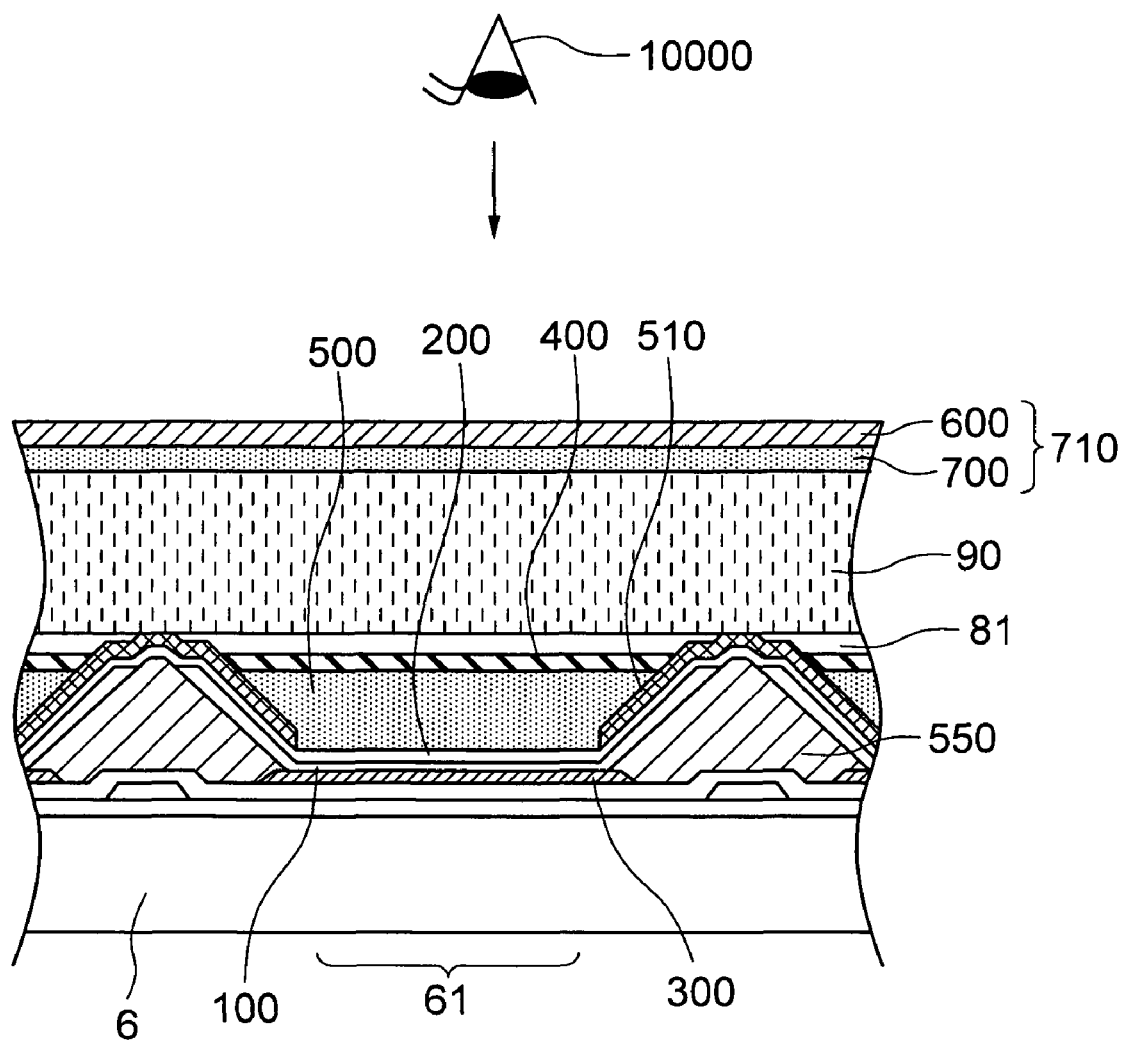
FIG. 13 is a cross-sectional view showing how an OLED display of this Embodiment is implemented (Embodiment 7).

FIG. 13 is a cross section of an OLED display as one Embodiment of this invention.

This OLED display has formed over the reflective electrode 300 an organic layer 100 which constitutes the OLED diode, over which a transparent electrode 200 is formed. Further, over the transparent electrode 200 is formed a waveguide layer 500, over which a nano-structure layer 400 that functions as a light extraction layer is formed. The organic layer 100 is hermetically sealed with a transparent sealing plate 90, with a gap 81 formed between the transparent sealing plate 90 and the nano-structure layer 400. On the transparent sealing plate 90 is arranged a circular polarizer 710 that prevents ambient light 908 reflected by the reflective electrode 300 and interfaces from going out of the device and thereby minimizes a reduction in contrast when the light-emitting device of this Embodiment is used in the OLED display.

The waveguide layer 500 preferably use a material with a refractive index roughly equal to or higher than that of the transparent electrode 200. In that case, the light produced by the organic layer 100 passes through the transparent electrode 200 and enters the waveguide layer 500. Light incident on the surface of the waveguide layer 500 at a smaller angle than the critical angle passes through the waveguide layer 500. Incident light striking the waveguide layer surface at an angle larger than the critical angle is totally reflected on the surface and propagates mainly in the waveguide layer 500. Evanescent waves leaking out from the waveguide layer 500 into the nano-structure layer 400 are scattered and extracted toward the outside. The light propagating in the waveguide layer 500 reaches a reflection layer 510 formed on a slope and is reflected by the reflection layer 510 to become image forming light.

The waveguide layer 500 may use a $TiO_2$ film and a high refractive index material that is made by dispersing fine particles such as $TiO_2$ in a resin material of high refractive index. When fine particles are mixed, they function as a scattering material for the light propagating in the waveguide layer 500, thus improving the external coupling efficiency. In that case, for the light that passes through the waveguide layer 500, the distance traveled by the light in the waveguide layer 500 is short and thus the percentage of light being scattered is small. But for the light that propagates in the waveguide layer 500, the distance traveled by the light in the waveguide layer 500 is longer than the thickness of the waveguide layer 500 so that it is subjected to an increased scattering effect, resulting in an improved light extraction. Since the light that propagates in the waveguide layer 500 is transformed into scattered light before it reaches the reflection layer 510, the percentage of light absorbed by the organic layer 100 and the reflective electrode 300 is small, improving the external coupling efficiency compared with a case where the nano-structure layer 400 is not provided.

When a resin is used for the waveguide layer 500, the waveguide layer 500 can be formed by performing a liquid-repellent treatment on the surface of the reflection layer 510, forming a layer of a compound of binder resin component and solvent by a film forming method, such as a spin coat method and a blade coat method, and then drying the layer for solidifying. Alternatively, the compound of binder resin component and solvent may be applied selectively onto areas enclosed by the reflection layers 510 by a printing technique such as an ink jet printing process to form a layer and then dried for solidifying.

Further, since the display of this invention has the waveguide layer 500 divided into individual pixel areas that are separated by the raised portions 550 of a third interlayer insulating layer, optical crosstalk and pixel color bleeding, which would result when light exiting from one pixel propagates into the adjoining pixel areas and goes out of the device, can be prevented realizing a clear, high quality display.

Further, on the substrate where drive elements and wires are formed, it is possible to planarize the display area including stepped or uneven portions. The surface of the display area can be planarized relatively easily by spin-coating an organic material. Planarizing the display area 2 allows the nano-structure layer 400 to be formed uniformly over the entire display area 2 as by a spin coating method. It is also possible to use a printing method and a nano-imprint method to uniformly form a light extraction layer, such as the nano-structure layer 400, rodlike nano-structure layer 402 and periodic structure layer, over the entire display area 2 with ease. This planarization is particularly effective when the device is used as an illumination device.

Further, by making the planarized waveguide layer 500 a transparent, highly dense waveguided layer with a gas barrier capability, the transparent sealing plate 90 may be eliminated. It is also possible to provide a transparent, highly dense layer between the waveguide layer 500 and the nano-structure layer 400 and use it as a gas barrier layer. The gas barrier waveguided layer may be formed of an inorganic material, such as silicon nitride and titanium oxide. When forming such an inorganic layer as by a CVD method, it is necessary to optimize the fabrication conditions, such as a flow of gas to be supplied, to form as fine or highly dense a layer as possible. The gas barrier waveguided layer may be constructed in two or more layers rather than in a single layer.

When this Embodiment is used as an illumination device, there is no need to provide the circular polarizer 710. If the waveguide layer 500 is made to serve also as a gas barrier layer, the transparent sealing plate 90 may be eliminated.

Further, when this Embodiment is used as a display, the circular polarizer 710 may be formed of a material having a smaller refractive index than that of the nano-structure layer 400 between the nano-structure layer 400 and the gap 81, or may be directly bonded to the nano-structure layer 400. When the circular polarizer 710 is directly bonded to the upper side of the nano-structure layer 400, the nano-structure layer 400 is desired that its thickness be set greater than the penetration depth of evanescent waves.

Further, to produce a clear and crisp image without optical crosstalks, the waveguide layer 500 may preferably be formed by the photolithography to optically separate individual pixel areas. With the transparent sealing plate 90 eliminated, the display can be made thinner and lighter in weight.

The raised portion 550 is patterned using an insulating material as by photolithography. The material for the raised portion 550 may include inorganic materials such as silicon oxide and silicon nitride or dielectric materials such as acrylic and polyimide. The raised portion 550 determines the height of the reflection layer 510 and the thickness of the waveguide layer 500, so it is desired that the raised portion 550 be formed more than a few μm high to realize a high external coupling efficiency. To form the protrusions of this height in a relatively short time, it is practical to use an organic material. The raised portion 550 becomes narrower in width away from the substrate 6 when viewed in cross section and its side surfaces are inclined relative to the surface of the substrate. The raised portion 550 may be formed by any technique as long as it can form a desired inclined surfaces. For example, a screen printing method and an ink jet direct writing method can be used.

Embodiment 8

Figure 14:
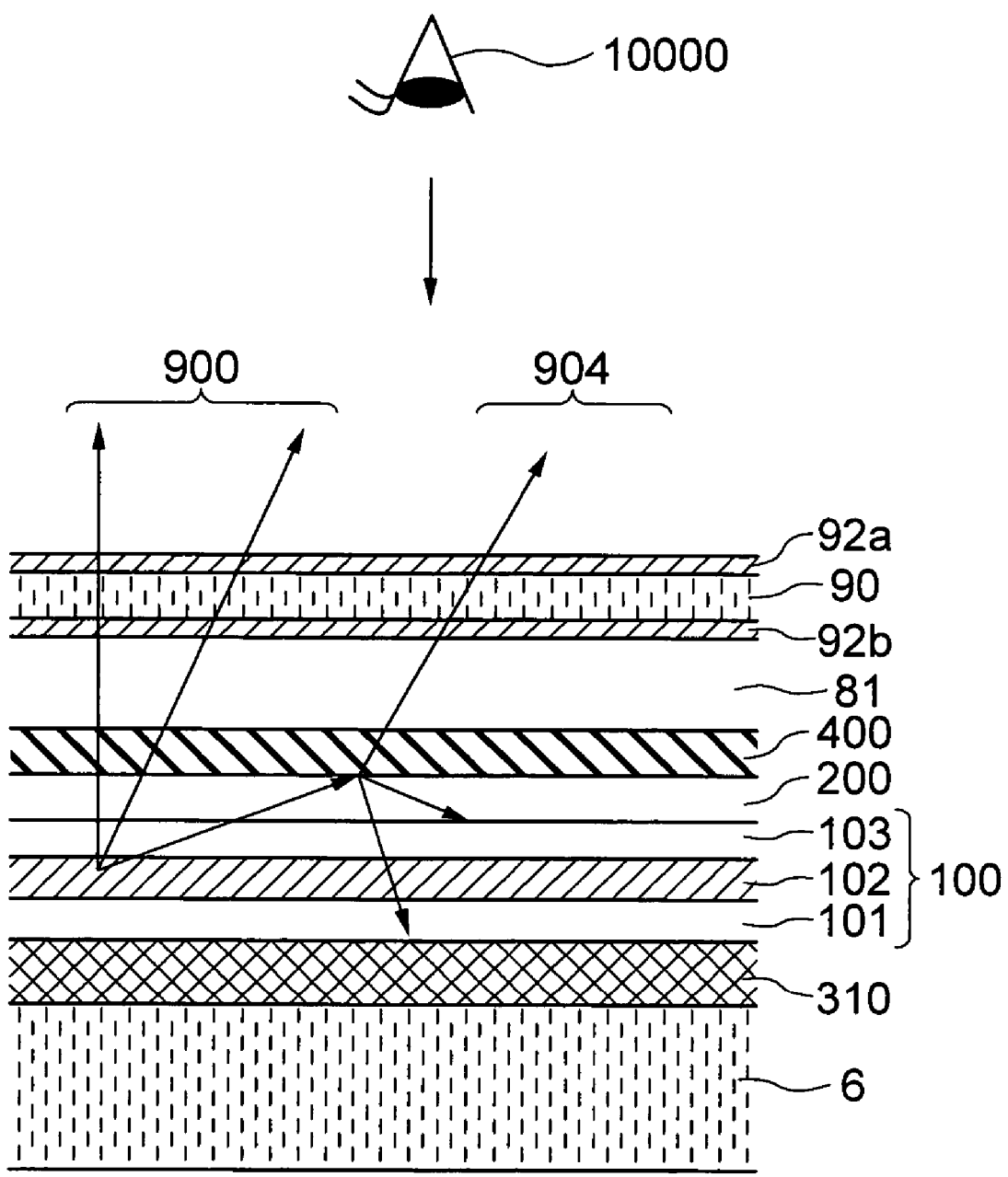
FIG. 14 is a cross-sectional view showing how a light-emitting device of this Embodiment is implemented (Embodiment 8).

FIG. 14 is a cross section of a light-emitting device as one Embodiment of this invention.

The light-emitting device of this Embodiment has formed over a blackened electrode 310 an organic layer 100 constituting an OLED diode, over which a transparent electrode 200 is formed. Over the transparent electrode 200 is formed a nano-structure layer 400 that functions as a light extraction layer. The organic layer 100 is hermetically sealed with a transparent sealing plate 90, with a gap 81 formed between the transparent sealing plate 90 and the nano-structure layer 400. The transparent sealing plate 90 is formed with reflection prevention layers 92a, 92b which, when the light-emitting device of this Embodiment is used in the optical type display, minimizes a reduction in contrast caused by ambient light reflection on the transparent sealing plate 90.

The blackened electrode 310 is made up of three layers—a thin metal layer having a light transmitting capability, a transparent conductive layer and a metal layer. By controlling the complex refractive index and thicknesses of these three layers, a front reflectivity of visible wavelengths can be kept at less than 1%. Since the blackened electrode 310 minimizes the reflectivity of ambient light entering from the front, a reduction in contrast caused by the ambient light reflection on the blackened electrode 310 can be reduced. In this Embodiment, therefore, there is no need to use a circular polarizer. Of the light produced by the organic layer 100, those rays emitted toward the blackened electrode 310 are absorbed by it, so that approximately half the light produced by the organic layer 100 is absorbed by the blackened electrode 310. However, since the circular polarizer is not used, the quantity of the transmitted light 900 that can be extracted is about the same as when the circular polarizer is used. Further, in this Embodiment, since the refractive indices of the transparent electrode 200, nano-structure layer 400 and gap 81 become smaller in that order, the nano-structure layer 400 functions also as a reflection prevention layer of the transparent electrode 200. To increase the reflection prevention effect, the refractive index $n_2$ and thickness t of the nano-structure layer 400 should preferably be selected as shown in Equations (7) and (8). In this Embodiment, since $n_1$ is around 1.8-2.1 and $n_2$ is approximately 1, $n_3$ is preferably set to 1.34-1.41. If $n_3$ is set to 1.1-1.41, the reflection prevention effect can be obtained. If the thickness of the nano-structure layer 400 in the display is changed and set for each pixel, a peak wavelength for each pixel need only be used for λ of Equation (8). If the thickness of the nano-structure layer 400 is made equal for the entire display area, λ is set to the wavelength of green light. Therefore, the thickness of the nano-structure layer 400 is preferably set to between 90 nm and 125 nm.

In this Embodiment, the use of the nano-structure layer 400 can make the reflectivity from the transparent electrode 200 less than 1%.

The blackened electrode 310 is not limited to this Embodiment and may use a metal layer of low reflectivity, such as Cr, Mo, Nb, W and Ta. It is also possible to provide a transparent conductive layer over the metal layer to reduce the reflectivity.

The reflectivity of the blackened electrode 310 needs to be smaller than that from the transparent electrode 200 to minimize a reduction in contrast. Thus, it must be less than 15% or preferably less than 10%.

In this Embodiment the use of the blackened electrode 310 can minimize a reduction in contrast and requires no circular polarizer, rendering its construction simple.

Embodiment 9

Figure 15:
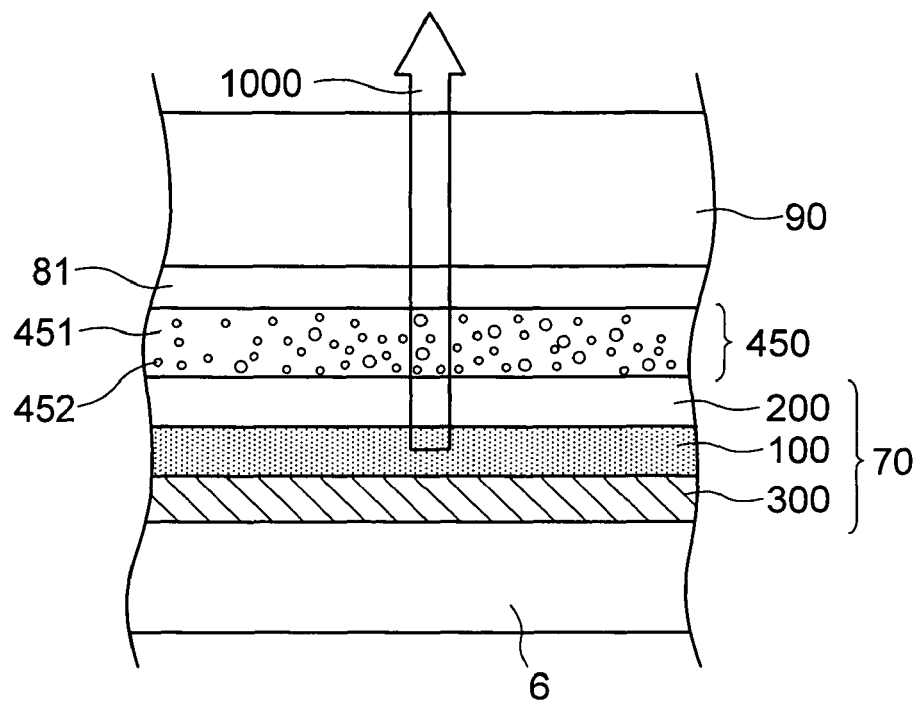
FIG. 15 is a cross-sectional view showing how a light-emitting device of this Embodiment is implemented (Embodiment 9).

FIG. 15 is a cross section of a light-emitting element as one Embodiment of this invention.

As described above, when the light-emitting device of this invention is used in a display, ambient light incident on the display from the surrounding environment needs to be considered. That is, the light extraction layer in the light-emitting device of this Embodiment is required to minimize ambient light reflection and it is important that light in the visible wavelength range is not scattered or diffracted by the light extraction layer and that the state of polarization of the light incident on the light extraction layer can be kept almost intact. However, when the light-emitting device is used as a light source of an illumination device, such as a backlight of a liquid crystal display, there is no need to take the influence of ambient light into consideration and thus the light extraction layer is not limited to the above-described nano-structure. In other words, when we focus on the function as light extraction, the most important characteristic of the light extraction layer is that of a light scattering layer with a low refractive index. Therefore, when the light extraction layer is used on an illumination device, there is no problem if it scatters light in the visible wavelength range.

FIG. 15 is a partial cross-sectional view showing an outline construction of a light-emitting device of this invention that can be used as a light source of an illumination device such as a backlight. This light-emitting device is of a so-called top-emission type that extracts light in a direction opposite the substrate 6 on which an OLED 70 is formed. Here our explanation concerns a light-emitting device in which a light extraction layer 450 is added to the organic light-emitting diode (OLED) 70 that is made up of a reflective electrode 300, a transparent electrode 200 and an organic layer 100 having a hole transporting layer, an emissive layer and an electron transporting layer stacked one upon the other between the reflective electrode 300 and the transparent electrode 200. It is noted that the invention is not limited to this configuration. That is, this invention can also be applied effectively to those electroluminescence devices and light-emitting diodes that use an organic material for the emissive layer.

It is preferred that the light source of an illumination device such as a backlight illuminate in white. The organic layer 100 that produces white light can be formed in two constructions, one that has a plurality of laminated emissive layers with different colors of emitted light and one that has a single emissive layer doped with dyes of different emitted light colors.

The former construction may, for example, be made by combining TPD, Alq3 partly doped with nile red and 1,2,4-triazole derivatives (TAZ). The latter may use PVK doped with three kinds of dyes or coloring matters, e.g., 1,1,4,4-tetraphenyl-1,3-butadiene (TPB), coumarin 6 and DCM1. In either case, it is preferred to use the white light emitting organic layer that has a high light emitting efficiency and a long life.

The light extraction layer 450 is provided on the side where light is extracted from the emissive layer, and is directly formed on the light extraction side of the transparent electrode 200 or through a transparent layer not shown that is formed as required. Further, the light extraction layer 450 has its refractive index set lower than the organic layer 100 including an emissive layer in order to increase the outward light extraction. Here, the light extraction layer 450 has mixed areas of different refractive indices so as to realize a low refractive index. The resultant refractive index is hereinafter called an average refractive index.

It is important to set the refractive index of a layer provided between the emissive layer 102 and the light extraction layer 450 higher than the average refractive index of the light extraction layer in realizing a bright light-emitting device that increases the outward light extraction. In other words, it is important that the average refractive index of the light extraction layer 450 be set lower than the refractive index of the emissive layer 102 and the refractive index of the layer provided between the emissive layer 102 and the light extraction layer 450.

This is because the presence of the layer with a low refractive index between the emissive layer 102 and the light extraction layer 450 causes a total reflection at an interface of this layer, increasing the quantity of light that propagates in an in-plane direction of the substrate 6, thereby limiting the quantity of light extracted outward.

It is therefore desired that the light extraction layer 450 be formed as close to the OLED 70 as possible and that a layer with a refractive index lower than that of the emissive layer, such as a glass substrate, be not interposed between the light extraction layer 450 and the OLED 70. To realize this, it is preferred in this Embodiment to form the light extraction layer 450 over the electrode on the light extraction side of the top-emission type device, i.e., over the transparent electrode 200.

As described above, since the average refractive index of the light extraction layer 450 is low, the quantity of light externally extracted increases. Considering producing a realistic effect on the conventional light-emitting device, i.e., producing an effect that offsets a cost increase caused by the addition of the light extraction layer 450, the average refractive index of the light extraction layer 450 should be set to 1.1-1.5. more preferably to 1.45 or less.

As the material of the light extraction layer 450, a transparent medium 451 may be used which is formed of a resin transparent to at least visible light and which is dispersed with a fine transparent substance 452 composed of fine particles or bubbles transparent to at least visible light and having a refractive index different from that of the transparent medium 451.

Among the possible materials for the transparent medium 451 are a light-curable transparent resin, a heat-reversible transparent resin, a hot cured transparent resin or a transparent resin with an added function of adhesive. During a film forming process, it is necessary to take precautions not to damage the organic layer.

To prevent or minimize a possible damage to the OLED 70 when the light extraction layer 450 is formed, a transparent layer not shown may be formed between the transparent electrode 200 and the light extraction layer 450. For this transparent layer, it is possible to use silicon oxide, silicon nitride or titanium oxide. To increase the quantity of externally extracted light, it is desired that the refractive index of the transparent layer be set equal to or higher than that of the emissive layer. To realize this, silicon nitride or titanium oxide may be used.

The fine transparent substance 452 is formed of transparent fine particles or air pores such as bubbles that have a refractive index different from that of the transparent medium 451. The transparent fine particles may use glass fine particles, melamine fine particles, styrene fine particles, benzoguanamine fine particles and polytetrafluoroethylene fine particles. The transparent fine particles may be formed into either a pebblelike shape or a rectangular prism shape. It is preferable to use ball-like fine particles that can scatter light isotropically.

As for the size, the fine transparent substance 452 is preferably set to approximately 1-10 μm to effectively scatter light in the visible wavelength range. From the standpoint of improving the quantity of externally extracted light, however, the fine transparent substance 452 may be formed also in a size of between several tens of nm and 1 μm that scatters light in a near ultraviolet wavelength range. That is, preferred size ranges from about 10 nm to 10 μm.

In one example a light extraction layer 450 20 μm thick may be made by using an acrylic transparent adhesive material with a refractive index of 1.47 as the transparent medium 451, using benzoguanamine fine particles with an average grain size of 2 μm and a refractive index of 1.57 (true specific gravity of 1.4) as the fine transparent substance 452, and dispersing 30 parts of fine transparent substance 452 (by weight relative to the solid component of adhesive agent) in the transparent medium 451. In this case, the average refractive index of the light extraction layer 450 is about 1.496, which is lower than the refractive index of the emissive layer 102 (about 1.7). Thus, the quantity of light extracted outward becomes larger than when the light extraction layer 450 is not provided, so that a light-emitting device obtained is brighter at the same power consumption.

The light extraction layer 450 20 μm thick may also be made by dispersing 25% by volume of polytetrafluoroethylene fine particles with an average particle size of 2 μm and a refractive index of 1.35 in an acrylic transparent adhesive material with a refractive index of 1.47. In this case, the average refractive index of the light extraction layer 450 is 1.44, which is lower than the refractive index of the emissive layer (about 1.7). Thus, the quantity of externally extracted light becomes larger than when the light extraction layer 450 is not provided, realizing a light-emitting device which is brighter at the same power consumption.

The refractive index of the fine particles making up the fine transparent substance 452 may be higher or lower than that of the transparent medium 451, as described above. For further reduction in the average refractive index of the light extraction layer 450, however, it is advantageous to use particles with a lower refractive index than that of the transparent medium 451. Further, rather than using transparent fine particles for the fine transparent substance 452, air cavities formed of bubbles can be used advantageously in realizing the light extraction layer 450 with an even lower average refractive index. The light extraction layer 450 containing fine transparent substance 452 formed of bubbles in the transparent medium 451 can be realized by adding a foaming agent in the transparent resin and heating and decomposing the foaming agent to generate a gas and therefore bubbles.

Normally, the organic layer 100 is susceptible to degradation by water in open air. Thus, the light extraction side of the light extraction layer 450 is preferably sealed hermetically with the transparent sealing plate 90, as shown in FIG. 15. The transparent sealing plate 90 may use a glass plate, a resin film treated with a gas barrier, and a lamination of a thin glass plate and a resin film. The transparent sealing plate 90 and the substrate 6 may preferably be bonded together and sealed by an adhesive sealing agent applied to their circumference.

The light extraction layer 450 and the transparent sealing plate 90 may be kept in hermetic contact with each other or, as shown in FIG. 15, a gap 81 may be provided between them and filled with a transparent material with a refractive index of around 1.4-1.6 which reduces a refractive index difference between the gap and the transparent sealing plate 90 or light extraction layer 450. With this arrangement, reflections on an interface between the light extraction layer 450 and the gap 81 or an interface between the gap 81 and the transparent sealing plate 90 can be reduced, increasing the quantity of externally extracted light.

Alternatively, the gap 81 may be sealed with an inert gas such as a nitrogen gas. In that case, the surface of the light extraction layer 450 is preferably made uneven or formed with a fine lens array pattern to increase the quantity of externally extracted light. Further, in this case, an absorbent is provided at a position between the transparent sealing plate 90 and the substrate 6 where it does not block the passage of light radiated from the emissive layer. It is also possible to coat a transparent humid absorbing layer on the light extraction layer 450 side of the transparent sealing plate 90.

The light-emitting device such as OLED diode has a thickness of several tens to several hundred of nm, about the light wavelength or less, and is made up of laminated thin layers with different refractive indices. Further, since the reflective electrode 300 often has a mirror surface, the light radiated from the emissive layer 102 is susceptible to interference. Thus, an ordinary OLED diode has a problem that, because of this interference, the light 1000 actually extracted outside has its spectrum vary depending on the direction of radiation, resulting in color changes. The similar problem also occurs with inorganic electroluminescence devices.

The light-emitting device of this invention is characterized in that, when it is used as a light source for an illumination device, the light extraction layer 450 uses a low refractive index scattering layer that scatters light also in the visible wavelength range. In this case, since light emitted from the device is scattered, producing mixed rays in various propagating directions and phases, changes in color caused by interference as the direction of emitted light changes can be greatly reduced. Further, since the light-emitting device of this invention uses a low refractive index scattering layer as the light extraction layer 450, it can minimize the color changes caused by interferences and at the same time increase the quantity of externally extracted light.

That is, a light-emitting device can be obtained which, for the same power consumption, is brighter and has smaller color changes that occur as the direction of emitted light changes. In other words, the light-emitting device of this invention requires less power for the same level of brightness and has smaller color variations that occur as the direction of emitted light changes.

Embodiment 10

Figure 16:
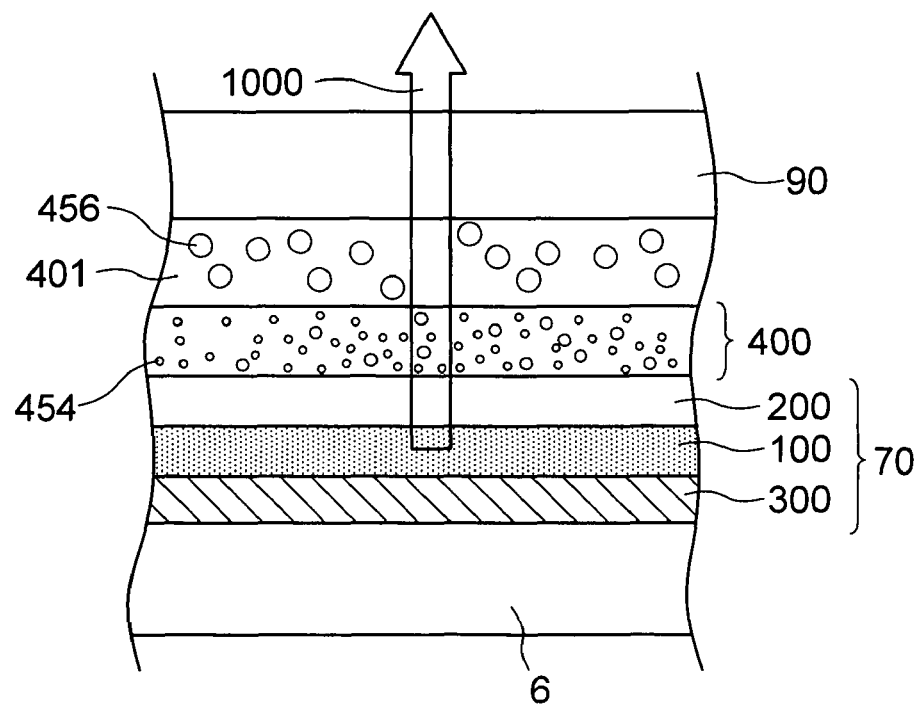
FIG. 16 is a cross-sectional view showing how a light-emitting device of this Embodiment is implemented (Embodiment 10).

FIG. 16 is a cross section of a light-emitting device as one Embodiment of this invention.

The light-emitting device of this Embodiment has formed over a reflective electrode 300 an organic layer 100 constituting an OLED diode, over which a transparent electrode 200 is formed. Over the transparent electrode 200 are formed a nano-structure layer 400 that functions as a light extraction layer and a nano-structure layer 401 that functions as a low refractive index layer. The organic layer 100 is hermetically sealed with the transparent sealing plate 90, with the nano-structure layer 401 provided between the transparent sealing plate 90 and the nano-structure layer 400.

The nano-structure layer 400 of this Embodiment is the same as in Embodiment 1. The addition of the nano-structure layer 401 improves the strength of the light-emitting device. A part of the light emitted from the organic layer 100 passes through the transparent electrode 200 and goes out of the light-emitting device as extracted light 1000. Further, light that propagates trapped in the transparent electrode 200 and the organic layer 100 is scattered by the nano-structure layer 400 and extracted outward.

The nano-structure layer 401 has the pore factor or size of pores 456, which are formed therein, differ from that of the nano-structure layer 400 so that the two nano-structure layers have different average refractive indices. The nano-structure layer 401 can be used in place of the gap 81 of Embodiment 1. In this case, the average refractive index of the nano-structure layer 401 is set smaller than that of the nano-structure layer 400. Making the average refractive index of the nano-structure layer 401 smaller can be realized by increasing the pore factor of the pores 456. It is desired that the nano-structure layer 400 be made a thin layer with a large ultraviolet light scattering capability and that the nano-structure layer 401 be made a highly transparent layer with a small scattering capability. That is, the average diameter of pores in the nano-structure layer 400 (first light extraction layer) is preferably set smaller than that of pores in the nano-structure layer 401 (second light extraction layer). The percentage of a volume that the pores occupy in the nano-structure layer 400 (first light extraction layer) is preferably set smaller than the percentage of a volume occupied by the pores in the nano-structure layer 401 (second light extraction layer).

The nano-structure layer 401 may be given an optical function. For instance, by controlling the thickness and the average refractive index of the nano-structure layer 401, characteristics such as color changes according to a visual angle can be improved. In this case, the nano-structure layer 401 may be set to a refractive index intermediate between those of the nano-structure layer 400 and the transparent sealing plate 90. The use of the stiff nano-structure layer 401 can make an optical characteristic more stable than when the gap is provided. Or, as in Embodiment 9, the nano-structure layer 401 may be given a light scattering capability to reduce color changes that occur as the direction of light emission changes.

Since the nano-structure layer 401 is sealed with the transparent sealing plate 90 without forming a gap, the light-emitting device has an increased strength and requires no desiccant. In this case, if the nano-structure layer 400 or the nano-structure layer 401 is made hydrophilic, a moisture absorbing effect can be produced, prolonging the life of the light-emitting device.

The nano-structure layer 401 may be formed over the nano-structure layer 400 or may be formed over the transparent sealing plate 90 and bonded to the nano-structure layer 400.

The provision of the light extraction layer allows light emitted from the emissive layer to be efficiently extracted outward, thereby offering a display and an illumination device capable of bright display and illumination.

The effect of improving the light extraction efficiency can also be utilized for the light-emitting device. Although this invention has been described by taking an OLED device as an example, it can also be applied to organic electroluminescence devices and light-emitting diodes to realize these devices with a high light extraction efficiency and a high level of brightness.

The emissive type display (OLED display) can be applied to monitors and televisions and, because of the improved light extraction efficiency, can reduce its power consumption allowing for its effective application to displays of portable devices such as mobile phones.

Further, the illumination device can be applied to an indoor illumination in addition to a backlight use.

It should be further understood by those skilled in the art that although the foregoing description has been made on Embodiments of the invention, the invention is not limited thereto and various changes and modifications may be made without departing from the spirit of the invention and the scope of the appended claims.

The invention claimed is:

1. A light-emitting device comprising:
a first electrode;
a second electrode; and
an emissive layer disposed between the first electrode and the second electrode; and
a part of light emitted from the emissive layer being extracted as radiated light; wherein
the first electrode, a light extraction layer to extract the radiated light, and a low refractive index layer having a lower refractive index than an average refractive index of the emissive layer and the light extraction layer are arranged in order in a direction in which the radiated light is extracted,
the first electrode is a transparent electrode,
the light extraction layer includes a material whose refractive index is more than 2, and an average refractive index of the light extraction layer is between 1.1 and 1.5, and
the light extraction layer is formed in a same specification for all the emissive layer over the entire emissive area and in contact with the first electrode, and
the light extraction layer scatters wave-guided light of the emitted light which is wave-guided in the first electrode.

2. A light-emitting device according to claim 1, wherein the low refractive index layer is a gas layer.

3. A light-emitting device according to claim 1, wherein a light scattering by the light extraction layer at an ultraviolet wavelength is larger than a light scattering at a visible wavelength.

4. A light-emitting device according to claim 1, wherein an average refractive index of the light extraction layer is between 1.1 and 1.41.

5. A light-emitting device according to claim 1, wherein the light extraction layer is 90-140 nm thick.

6. A light-emitting device according to claim 1, wherein a surface resistivity of the light extraction layer is less than $1 \times 10^{11} \Omega$.

7. A light-emitting device according to claim 1, wherein an average refractive index of the light extraction layer is between 1.1 and 1.3.

8. A light-emitting device according to claim 1, wherein the light extraction layer is in contact with the low refractive index layer.

9. A light-emitting device according to claim 3, wherein the light-emitting device is formed on a substrate and light is extracted from that side of the emissive layer which is opposite from where the substrate is arranged.

10. A light-emitting device according to claim 3, wherein the light-emitting device is an organic light-emitting diode.

11. A light-emitting device according to claim 3, wherein the light extraction layer is 40-400 nm thick.

12. A light-emitting device according to claim 3, wherein the light extraction layer has pores.

13. A light-emitting device according to claim 3, wherein the light extraction layer has a haze value of 0%-1% at a wavelength of 555 nm and a haze value of more than 1% at 380 nm.

14. A light-emitting device according to claim 12, wherein the light extraction layer includes a hydrophilic material and a retaining material, said retaining material holding said hydrophilic material.

* * * * *